United States Patent
Yoneta et al.

(10) Patent No.: US 10,068,800 B2
(45) Date of Patent: Sep. 4, 2018

(54) MANUFACTURING METHOD FOR SOLID-STATE IMAGING DEVICE AND SOLID-STATE IMAGING DEVICE

(71) Applicant: HAMAMATSU PHOTONICS K.K., Hamamatsu-shi, Shizuoka (JP)

(72) Inventors: Yasuhito Yoneta, Hamamatsu (JP); Ryoto Takisawa, Hamamatsu (JP); Shingo Ishihara, Hamamatsu (JP); Hisanori Suzuki, Hamamatsu (JP); Masaharu Muramatsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/407,633

(22) PCT Filed: Feb. 21, 2013

(86) PCT No.: PCT/JP2013/054392
§ 371 (c)(1),
(2) Date: Dec. 12, 2014

(87) PCT Pub. No.: WO2013/187086
PCT Pub. Date: Dec. 19, 2013

(65) Prior Publication Data
US 2015/0187649 A1 Jul. 2, 2015

(30) Foreign Application Priority Data
Jun. 15, 2012 (JP) .................. 2012-136198

(51) Int. Cl.
*H01L 31/0203* (2014.01)
*H01L 21/77* (2017.01)
(Continued)

(52) U.S. Cl.
CPC .......... *H01L 21/77* (2013.01); *H01L 27/1464* (2013.01); *H01L 27/1469* (2013.01);
(Continued)

(58) Field of Classification Search
CPC ................................. H01L 27/14634
(Continued)

(56) References Cited

U.S. PATENT DOCUMENTS

| 2003/0069349 A1* | 4/2003 | Sumita | C08G 59/306 524/588 |
| 2009/0309231 A1 | 12/2009 | Machida | |
| 2012/0146161 A1* | 6/2012 | Lin | B82Y 40/00 257/412 |

FOREIGN PATENT DOCUMENTS

| JP | H11-191670 | 7/1999 |
| JP | 2004-057507 A | 2/2004 |

(Continued)

OTHER PUBLICATIONS

Machine translation of Suzuki et al., JP 2010-225778, Oct. 7, 2010.*
(Continued)

*Primary Examiner* — Hsin-Yi Hsieh
(74) *Attorney, Agent, or Firm* — Drinker Biddle & Reath LLP

(57) ABSTRACT

A method for manufacturing a solid-state imaging device comprises a first step of preparing an imaging element having a second principal surface having an electrode arranged thereon, and a photoelectric converter part configured to photoelectrically convert the incident energy line so as to generate a signal charge; a second step of preparing a support substrate, provided with a through hole extending in a thickness direction thereof, having a third principal surface; a third step of aligning the imaging element and the support substrate with each other so that the electrode is (Continued)

exposed out of the through hole while the second and third principal surfaces oppose each other and joining the imaging element and the support substrate to each other; and a fourth step of arranging a conductive ball-shaped member in the through hole and electrically connecting the ball-shaped member to the electrode after the third step.

7 Claims, 21 Drawing Sheets

(51) Int. Cl.
    *H01L 27/146*     (2006.01)
    *H04N 5/369*     (2011.01)

(52) U.S. Cl.
    CPC ....... *H01L 27/14634* (2013.01); *H04N 5/369* (2013.01); *H01L 27/14636* (2013.01); *H01L 2224/11* (2013.01); *Y10T 29/49124* (2015.01)

(58) Field of Classification Search
    USPC ........................................................ 257/433
    See application file for complete search history.

(56) References Cited

FOREIGN PATENT DOCUMENTS

| JP | 2005-108991 | 4/2005 |
| JP | 2007-013089 A | 1/2007 |
| JP | 2008-300613 A | 12/2008 |
| JP | 2010-199602 A | 9/2010 |
| JP | 2010-225778 | 10/2010 |
| JP | 2011-014572 | 1/2011 |
| JP | 2011-086828 | 4/2011 |

OTHER PUBLICATIONS

English-language translation of International Preliminary Report on Patentability (IPRP) dated Dec. 24, 2014 that issued in WO Patent Application No. PCT/JP2013/054392.

\* cited by examiner

Fig.4
(a)
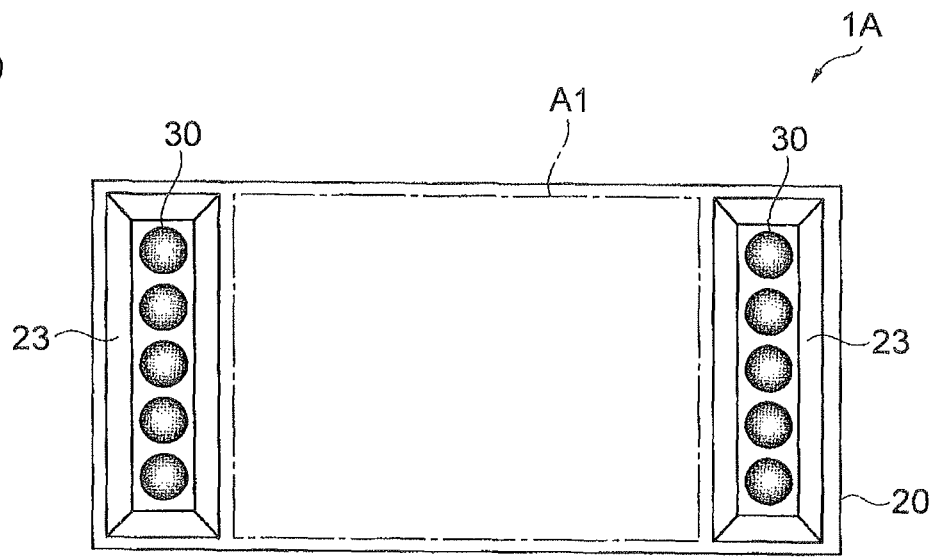
(b)
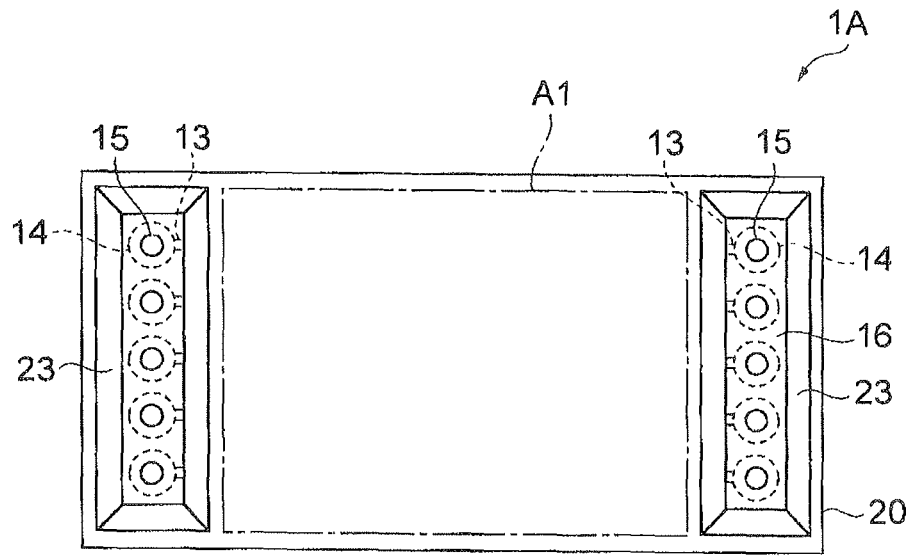

*Fig.16*
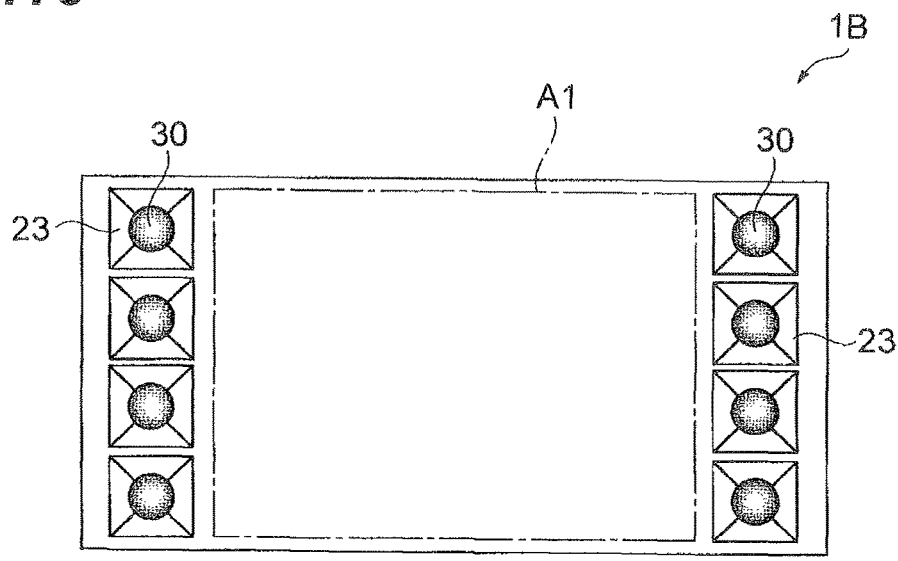
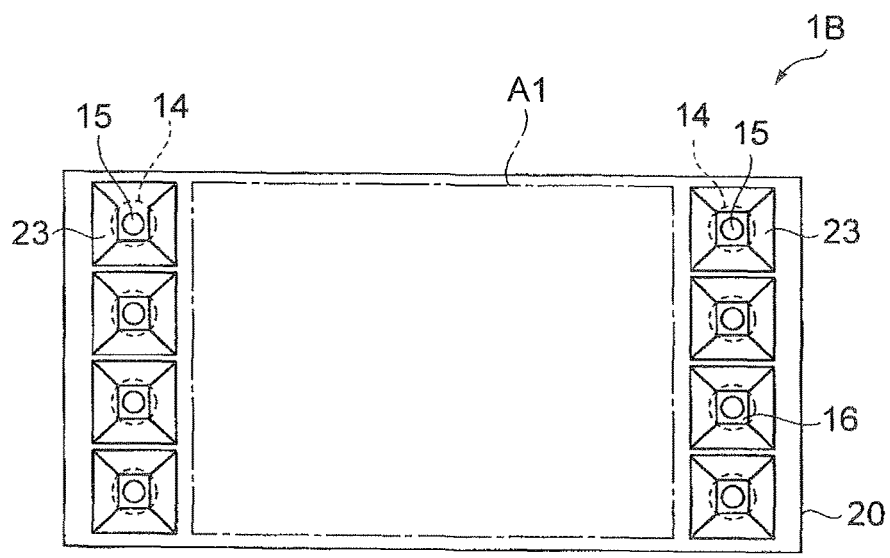

MANUFACTURING METHOD FOR SOLID-STATE IMAGING DEVICE AND SOLID-STATE IMAGING DEVICE

TECHNICAL FIELD

The present invention relates to a method for manufacturing a solid-state imaging device and the solid-state imaging device.

BACKGROUND ART

Patent Literature 1 discloses a back-illuminated solid-state imaging device using a CMOS image sensor (hereinafter referred to as "sensor"). This solid-state imaging device comprises a support substrate having a pair of principal surfaces opposing each other and a sensor disposed on one principal surface of the support substrate. The support substrate has a through electrode extending in its thickness direction and penetrating therethrough. One end part of the through electrode is electrically connected to an electrode of the sensor. The other end part of the through electrode is exposed at the other principal surface of the support substrate. In a state where the solid-state imaging device is mounted on an IC chip for signal processing, the other end part of the through electrode is electrically connected to an electrode of the IC chip through a bump electrode.

The method for manufacturing the above-mentioned solid-state imaging device includes the steps of joining the sensor to the support substrate, forming a resist pattern on the other principal surface of the support substrate, etching the support substrate from the other principal surface side so as to form a through hole, and filling the through hole with a metal so as to form the through electrode.

CITATION LIST

Patent Literature

Patent Literature 1: Japanese Patent Application Laid-Open No. 2007-13089

SUMMARY OF INVENTION

Technical Problem

It is necessary for the above-mentioned back-illuminated solid-state imaging device to make the sensor as thin as possible so as to enhance its light-receiving sensitivity, since light or various energy lines (e.g., UV rays, electron beams, radiations, charged particle beams, and the like) enter the sensor from the back side. However, the sensor reduces its mechanical strength as it is made thinner, thereby becoming harder to handle.

For securing the mechanical strength, the sensor may partly be made thinner at its light-receiving part, while letting thicker outer edge parts surround the light-receiving part. However, the presence of the outer edge parts makes the area of the light-receiving part relatively small with respect to the area of the sensor, thereby lowering the light-receiving efficiency per unit area of the sensor. For enhancing the light-receiving efficiency by thinning the whole surface of the sensor while securing its mechanical strength, the above-mentioned solid-state imaging device does not use the sensor by itself but joins it to the support substrate.

The above-mentioned solid-state imaging device electrically connects the sensor and the IC chip to each other by using the through electrode. This makes it unnecessary to use wire bonding for electrically connecting the sensor and the IC chip to each other and thus can achieve a smaller size.

However, it takes a high degree of technical difficulty to provide the support substrate with the through hole after joining the sensor and the support substrate to each other, which may lower the yield.

It is an object of the present invention to provide a method for manufacturing a solid-state imaging device which enables easy manufacture and the solid-state imaging device.

Solution to Problem

The method for manufacturing a solid-state imaging device in accordance with one aspect of the present invention comprises a first step of preparing an imaging element including a first principal surface for receiving an energy line incident thereon, a second principal surface opposing the first principal surface and having an electrode arranged thereon, and a photoelectric converter part for photoelectrically converting the incident energy line so as to generate a signal charge; a second step of preparing a support substrate, provided with a through hole extending in a thickness direction thereof, having third and fourth principal surfaces opposing each other; a third step of aligning the imaging element and the support substrate with each other so that the electrode is exposed out of the through hole while the second and third principal surfaces oppose each other and joining the imaging element and the support substrate to each other; and a fourth step of arranging a conductive ball-shaped member in the through hole and electrically connecting the ball-shaped member to the electrode after the third step.

In the method for manufacturing a solid-state imaging device in accordance with this aspect of the present invention, the ball-shaped member is arranged in the through hole of the support substrate joined to the imaging element, and the ball-shaped member and the electrode are electrically connected to each other. Therefore, the electrical connection step is easy when manufacturing the solid-state imaging device. Hence, the solid-state imaging device can be manufactured easily, and the yield can be improved.

The electrode may be formed with a plating film after the third step but before the fourth step. In this case, the ball-shaped member is connected more securely to the electrode through the plating film.

The through hole may be formed such that the diameter thereof increases as the through hole extends from the third principal surface to the fourth principal surface. This makes it easier to arrange the ball-shaped member in the through hole in the third step.

The support substrate may be provided with at least one through hole so that a plurality of electrodes correspond to one through hole, in the third step, the imaging element and the support substrate may be aligned with each other so that the plurality of electrodes are exposed out of one through hole, and, in the fourth step, the ball-shaped members may electrically be connected to each electrode individually.

The support substrate may be provided with at least one through hole so that one electrode corresponds to one through hole, in the third step, the imaging element and the support substrate may be aligned with each other so that one electrode is exposed out of one through hole, and, in the fourth step, the ball-shaped members may electrically be connected to each electrode individually. In this case, simply arranging the ball-shaped members individually in the through holes can easily make the ball-shaped members and the electrodes correspond to each other.

A resin material may be arranged in the through hole. In this case, the resin material can securely fix the ball-shaped member into the through hole.

The electrode and second principal surface of the imaging element prepared by the first step may be covered with a flattening film, and the flattening film may partly be removed so as to expose at least a part of a surface of the electrode after the third step but before the fourth step. In this case, the surface of the imaging element is flattened by the flattening film, whereby the joint between the imaging element and the support substrate becomes more secure.

The solid-state imaging device in accordance with another aspect of the present invention comprises an imaging element including a first principal surface for receiving an energy line incident thereon, a second principal surface opposing the first principal surface and having an electrode arranged thereon, and a photoelectric converter part for photoelectrically converting the incident energy line so as to generate a signal charge; a support substrate, provided with a through hole extending in a thickness direction thereof, having third and fourth principal surfaces opposing each other, the support substrate being joined to the imaging element so that the electrode is exposed out of the through hole while the second and third principal surfaces oppose each other; and a conductive ball-shaped member arranged in the through hole and electrically connected to the electrode.

The solid-state imaging device in accordance with this aspect of the present invention is manufactured by arranging the ball-shaped member in the through hole of the support substrate joined to the imaging element and electrically connecting the ball-shaped member and the electrode to each other. Therefore, the electrical connection step is easy when manufacturing the solid-state imaging device.

The electrode may be formed with a plating film. In this case, the ball-shaped member is connected more securely to the electrode through the plating film.

The through hole may be formed such that the diameter thereof increases as the through hole extends from the third principal surface to the fourth principal surface. This makes it easier to arrange the ball-shaped member in the through hole when manufacturing the solid-state imaging device.

The support substrate may be provided with at least one through hole so that a plurality of electrodes are exposed out of one through hole, and the ball-shaped members may electrically be connected to each electrode individually.

The support substrate may be provided with at least one through hole so that one electrode is exposed out of one through hole, and the ball-shaped members may electrically be connected to each electrode individually. In this case, simply arranging the ball-shaped members individually in the through holes can easily make the ball-shaped members and the electrodes correspond to each other.

A resin material may be arranged in the through hole. In this case, the resin material can securely fix the ball-shaped member into the through hole.

A flattening film covering the second principal surface may further be provided, and at least a part of a surface of the electrode may be exposed out of the flattening film. In this case, the surface of the imaging element is flattened by the flattening film, whereby the joint between the imaging element and the support substrate becomes more secure.

Advantageous Effects of Invention

Various aspects of the present invention can provide a method for manufacturing a solid-state imaging device which enables easy manufacture and the solid-state imaging device.

BRIEF DESCRIPTION OF DRAWINGS (a) of FIG. 1 is a top plan view of an electronic component in accordance with a first embodiment, while (b) of FIG. 1 is a sectional view taken along the line B-B of (a) of FIG. 1;

Figure 5:
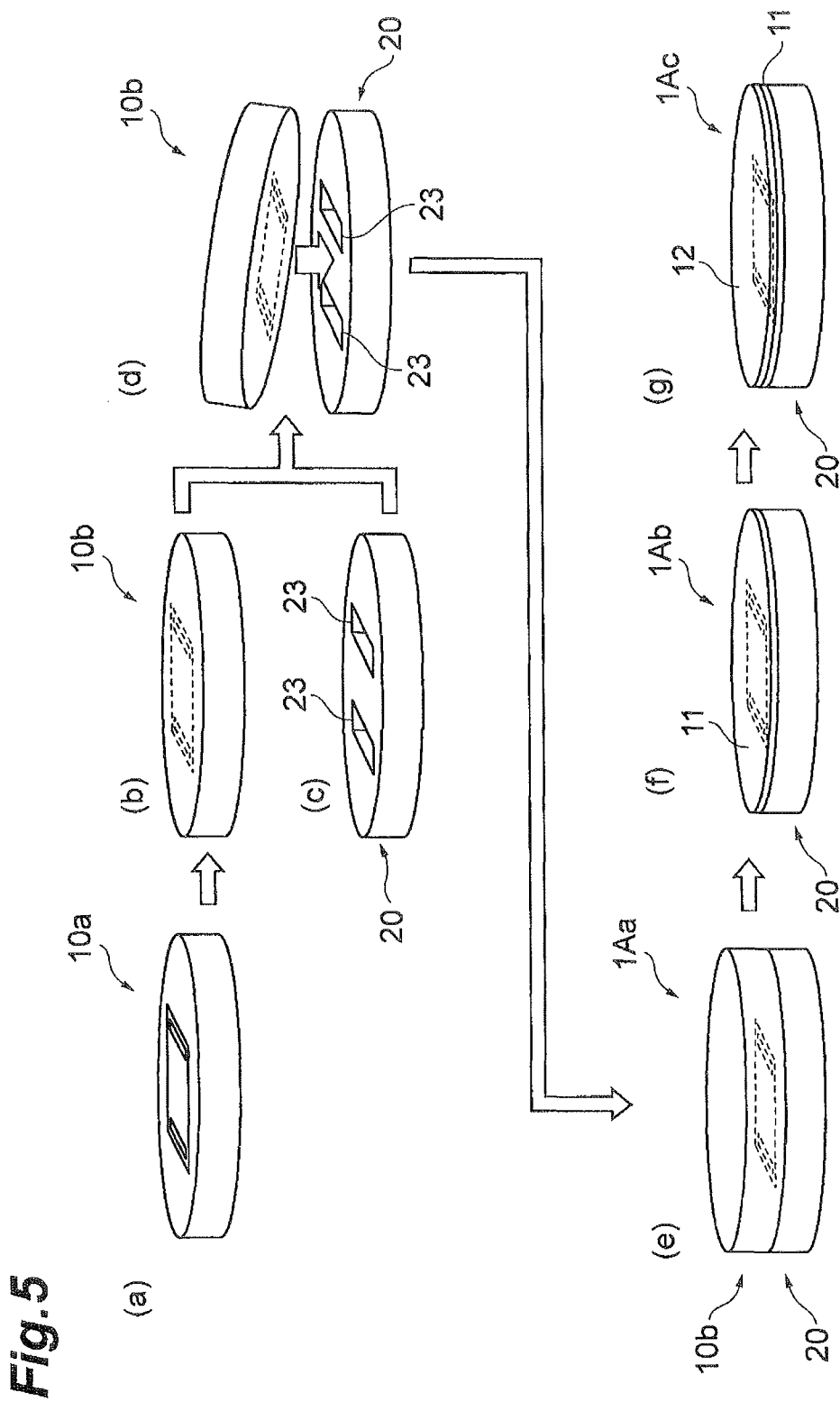
Figure 6:
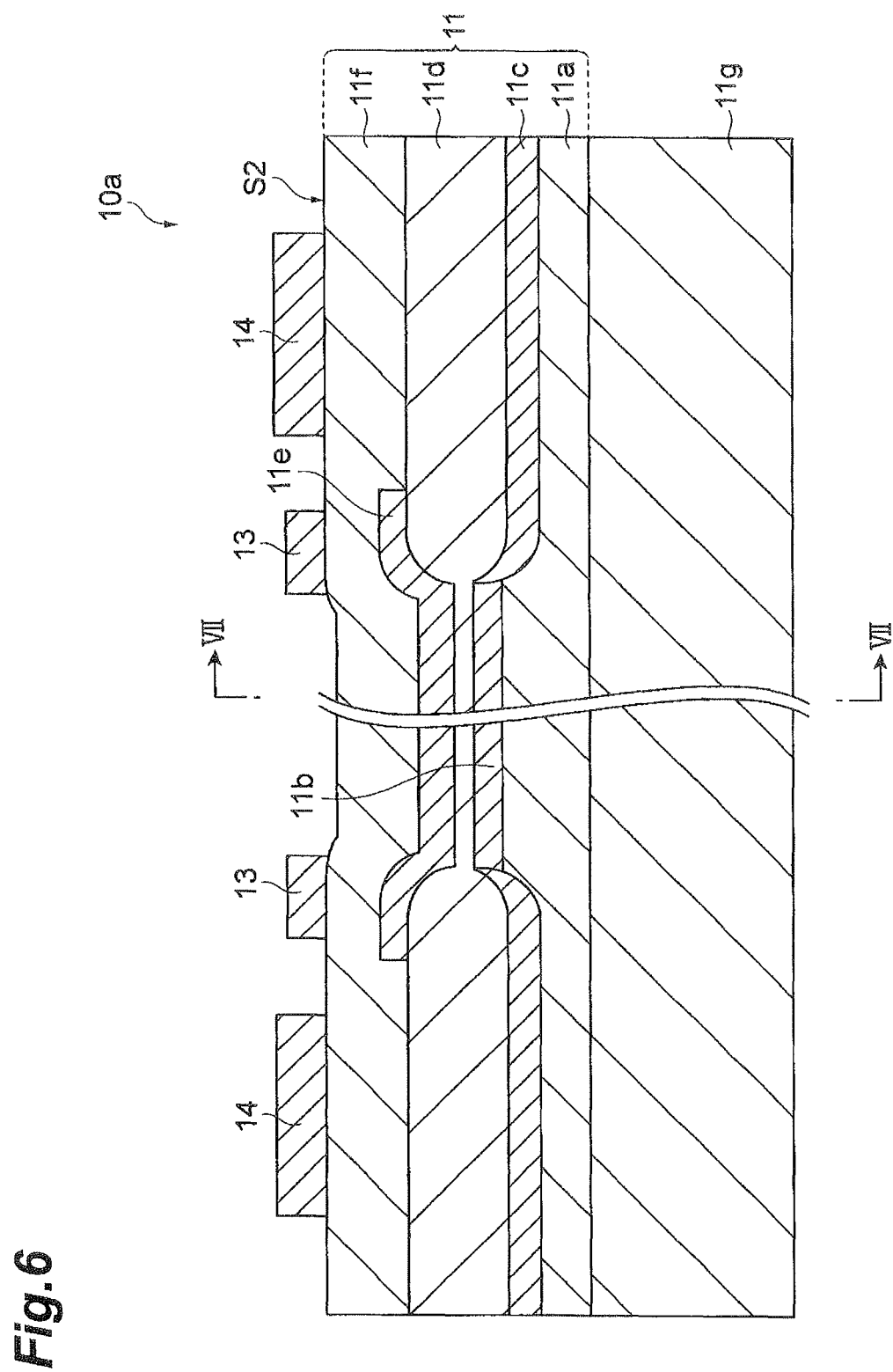
Figure 7:
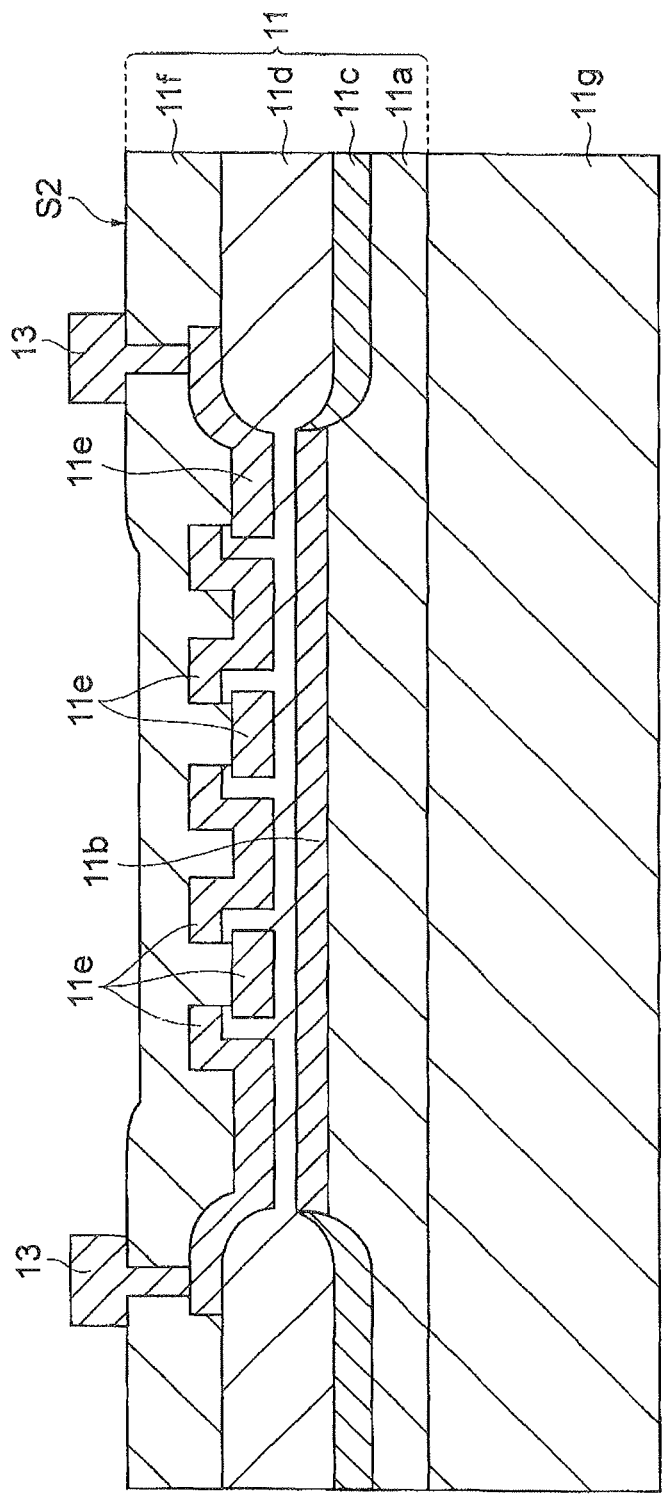
Figure 8:
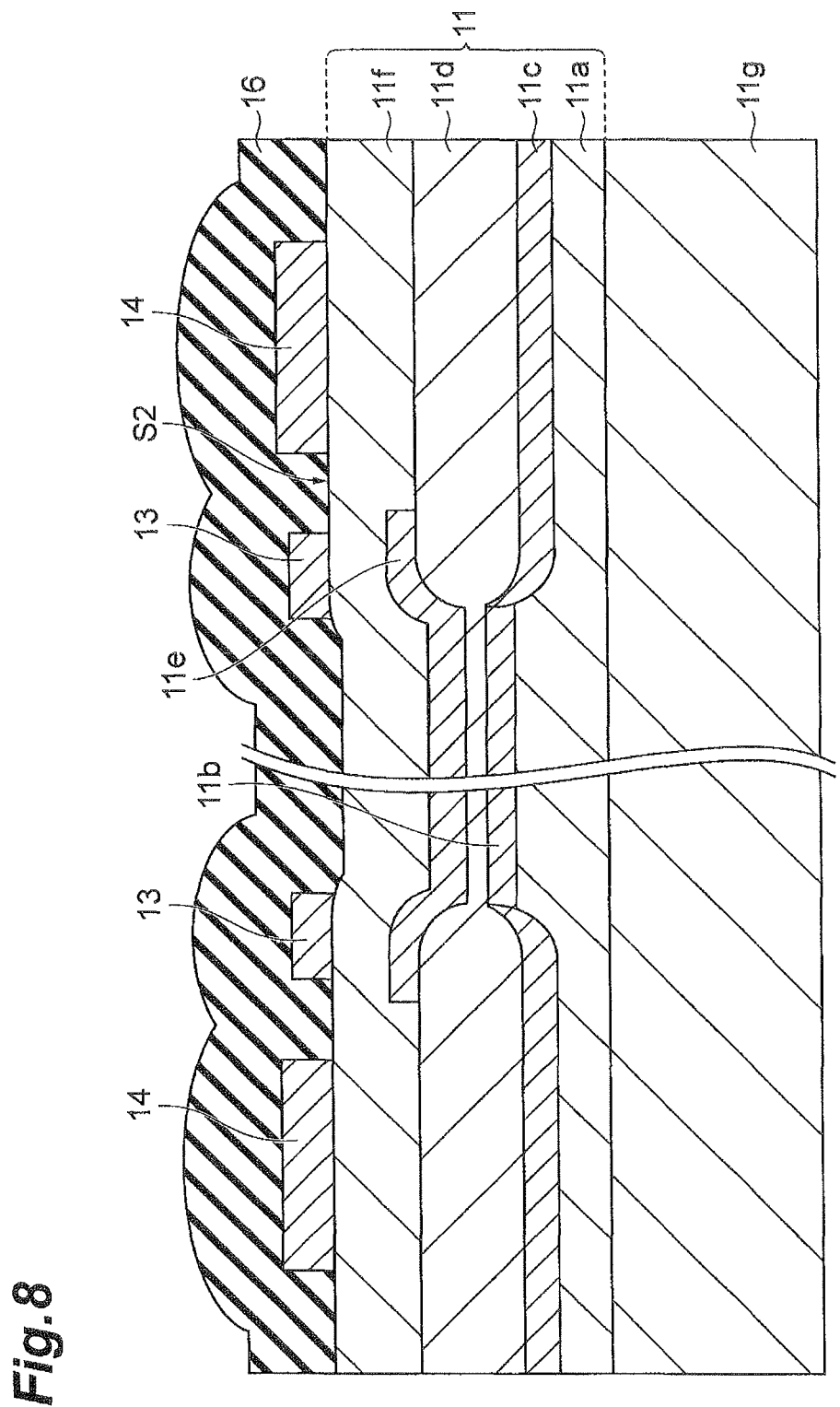
Figure 9:
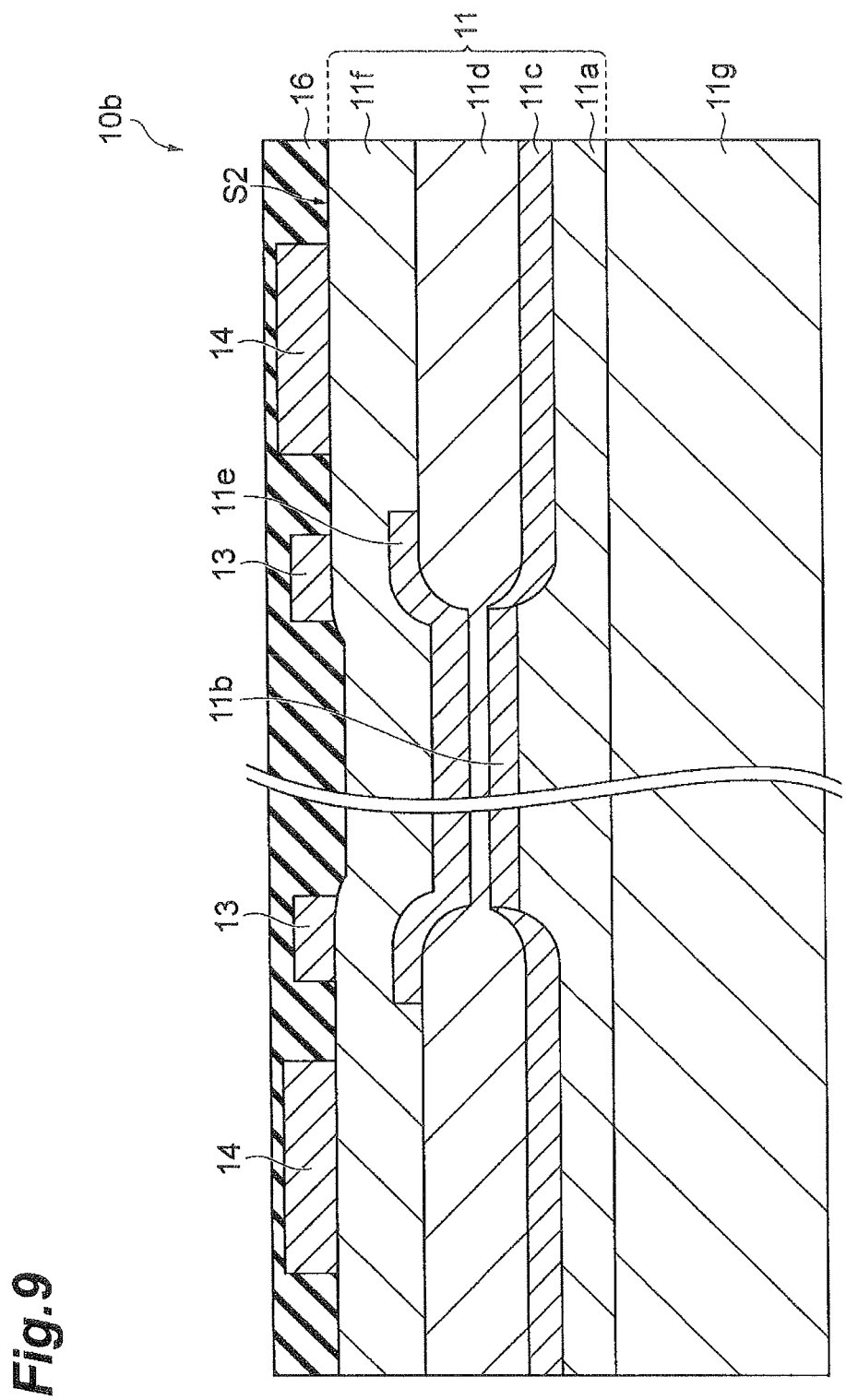
Figure 10:
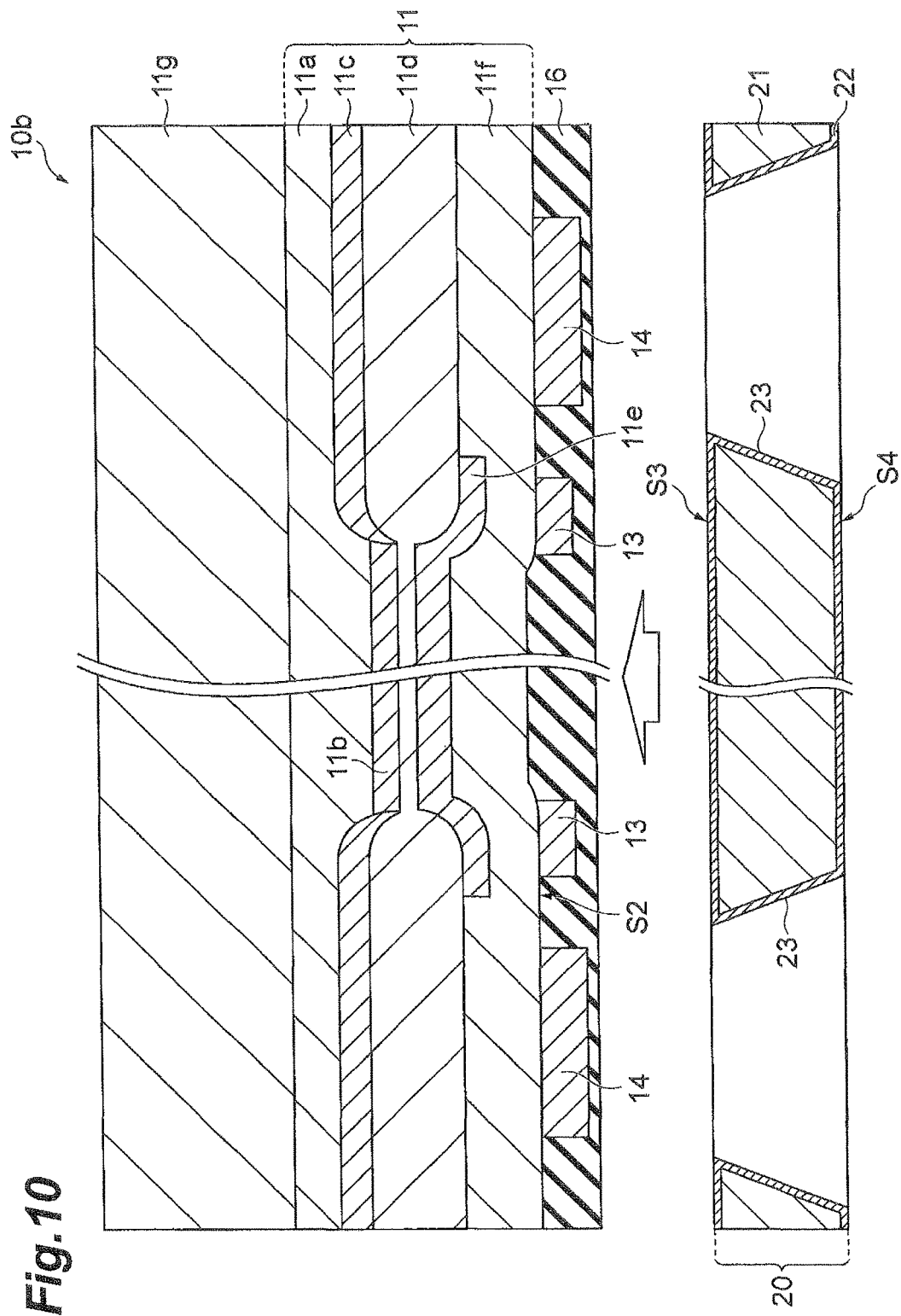
Figure 11:
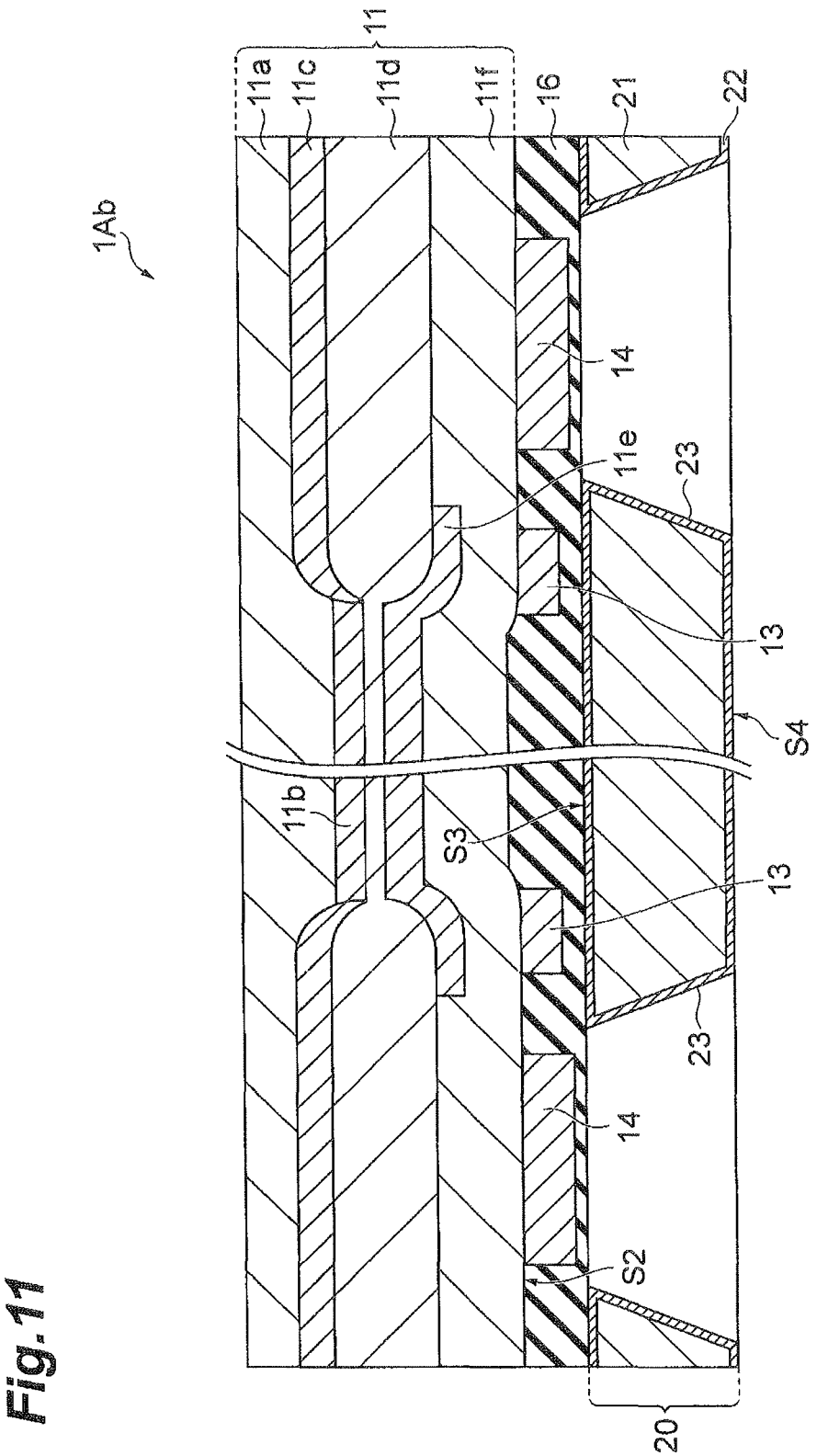
Figure 12:
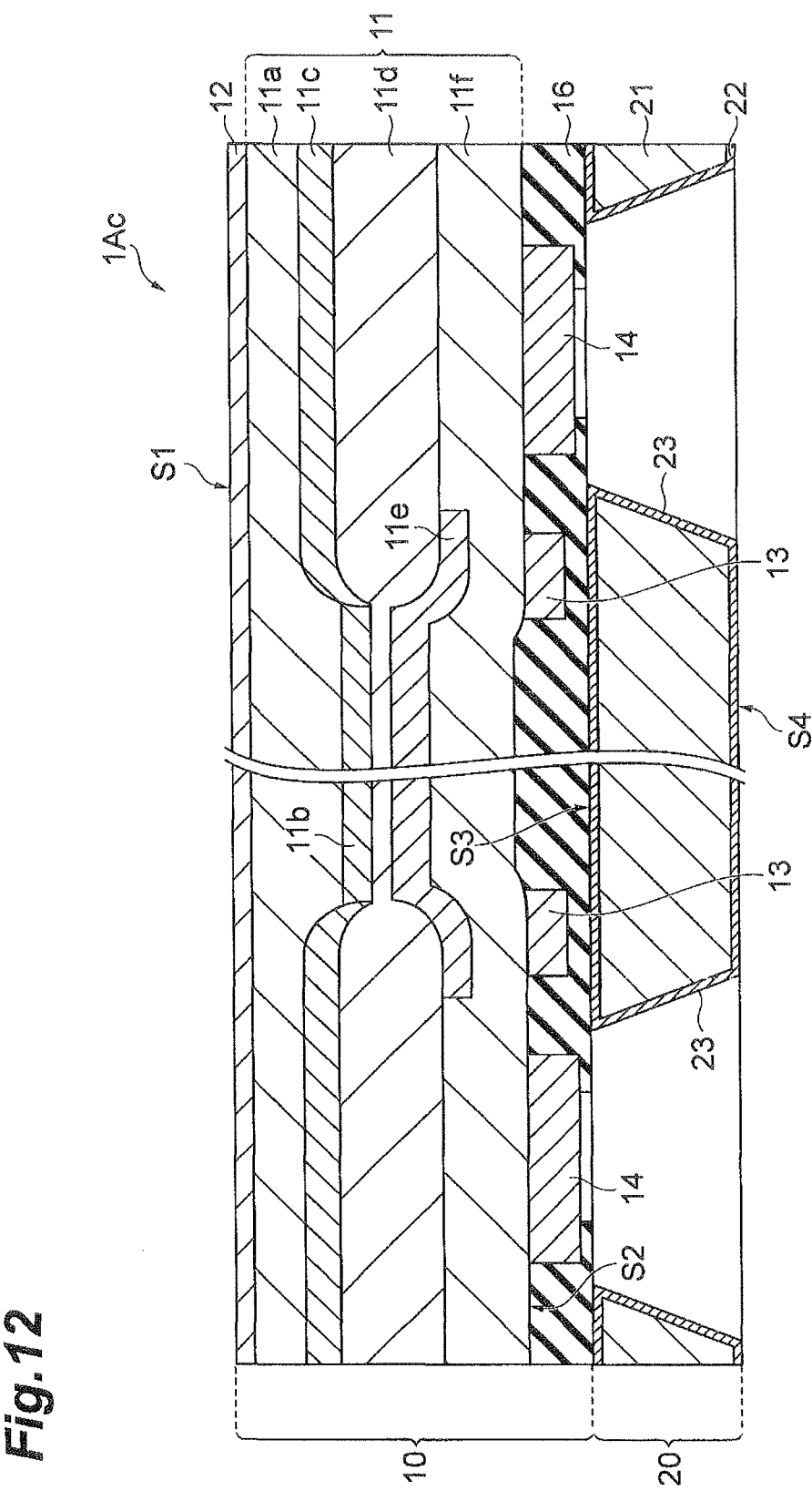
Figure 13:
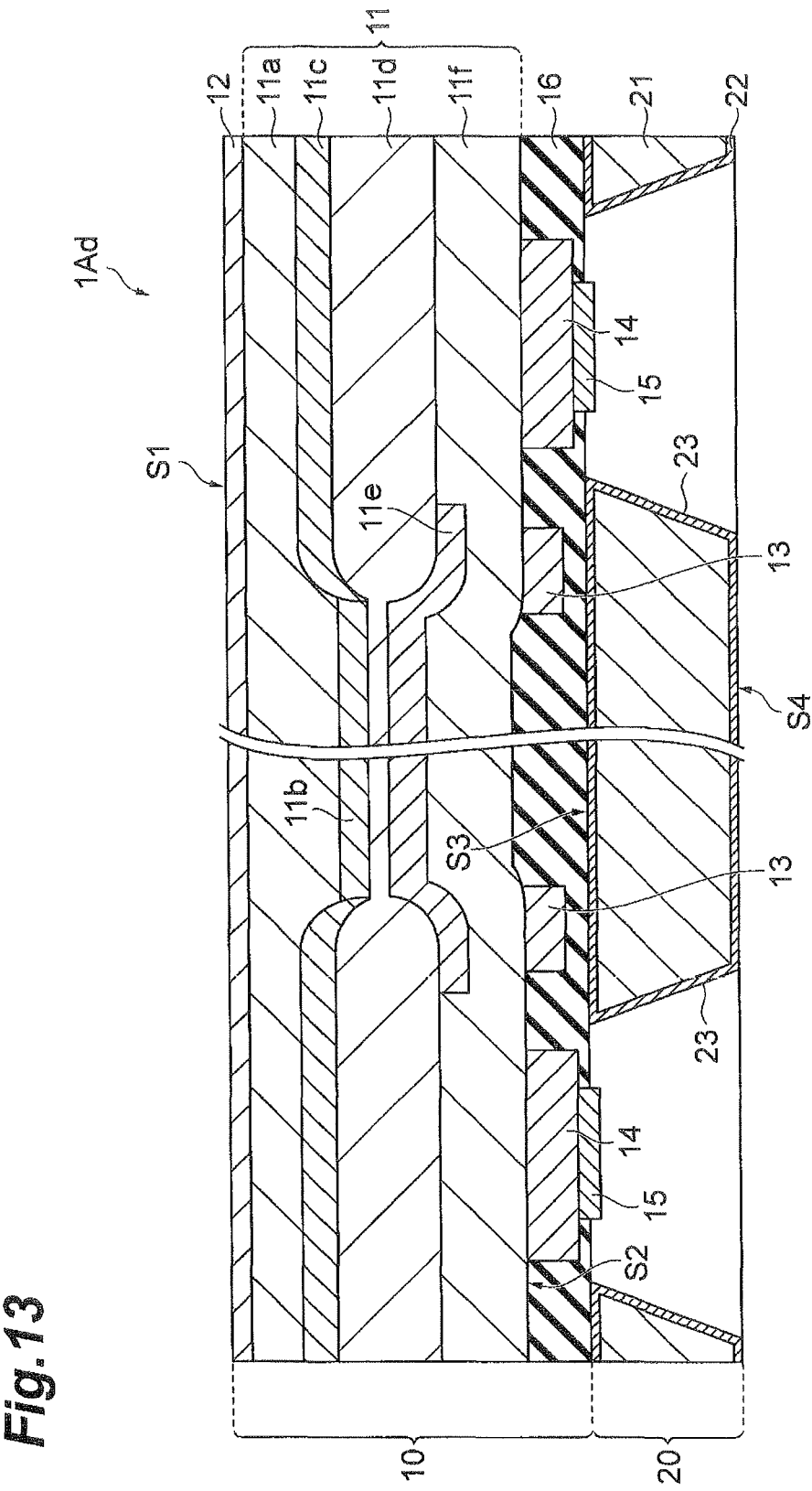
Figure 14:
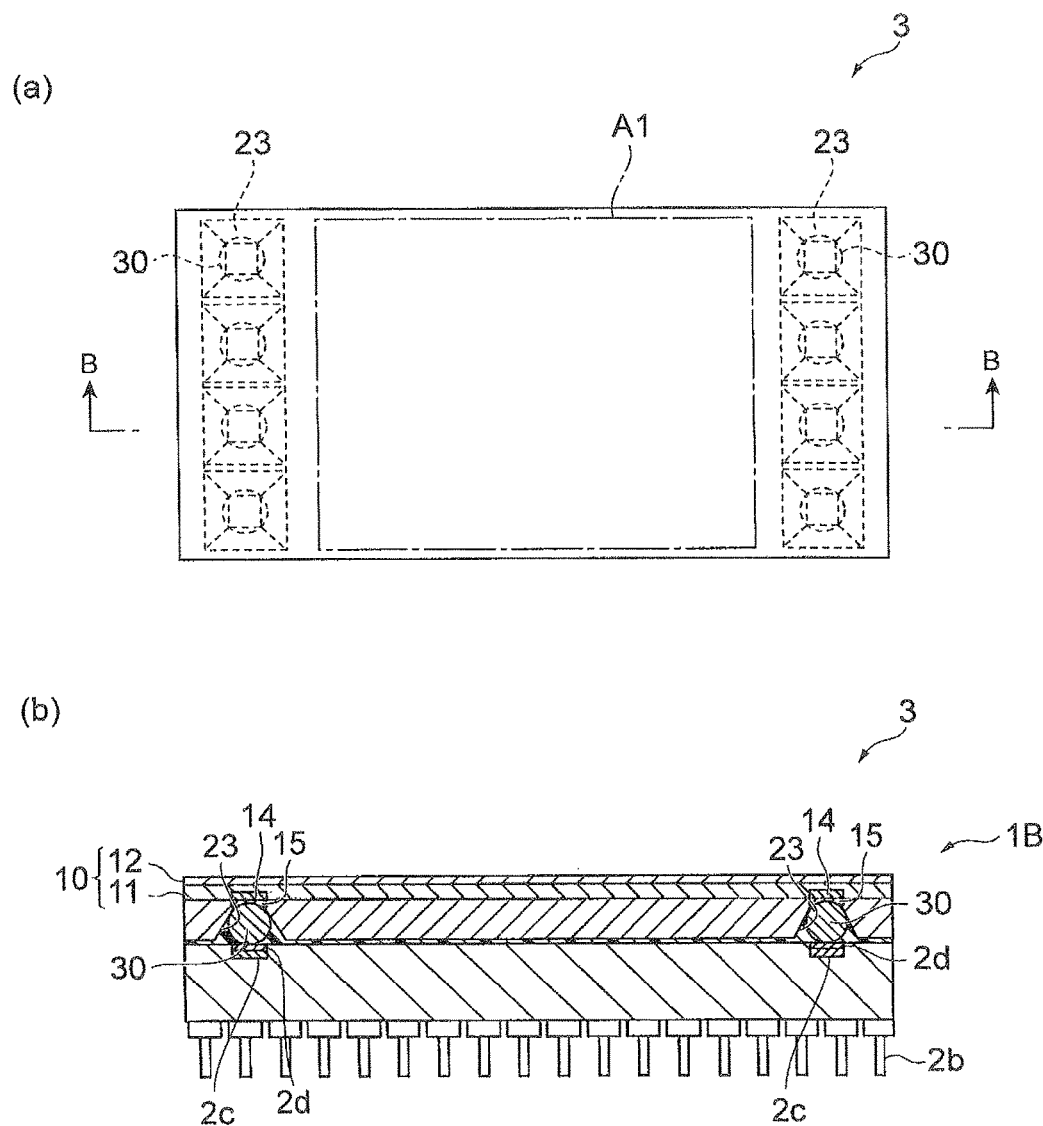
Figure 15:
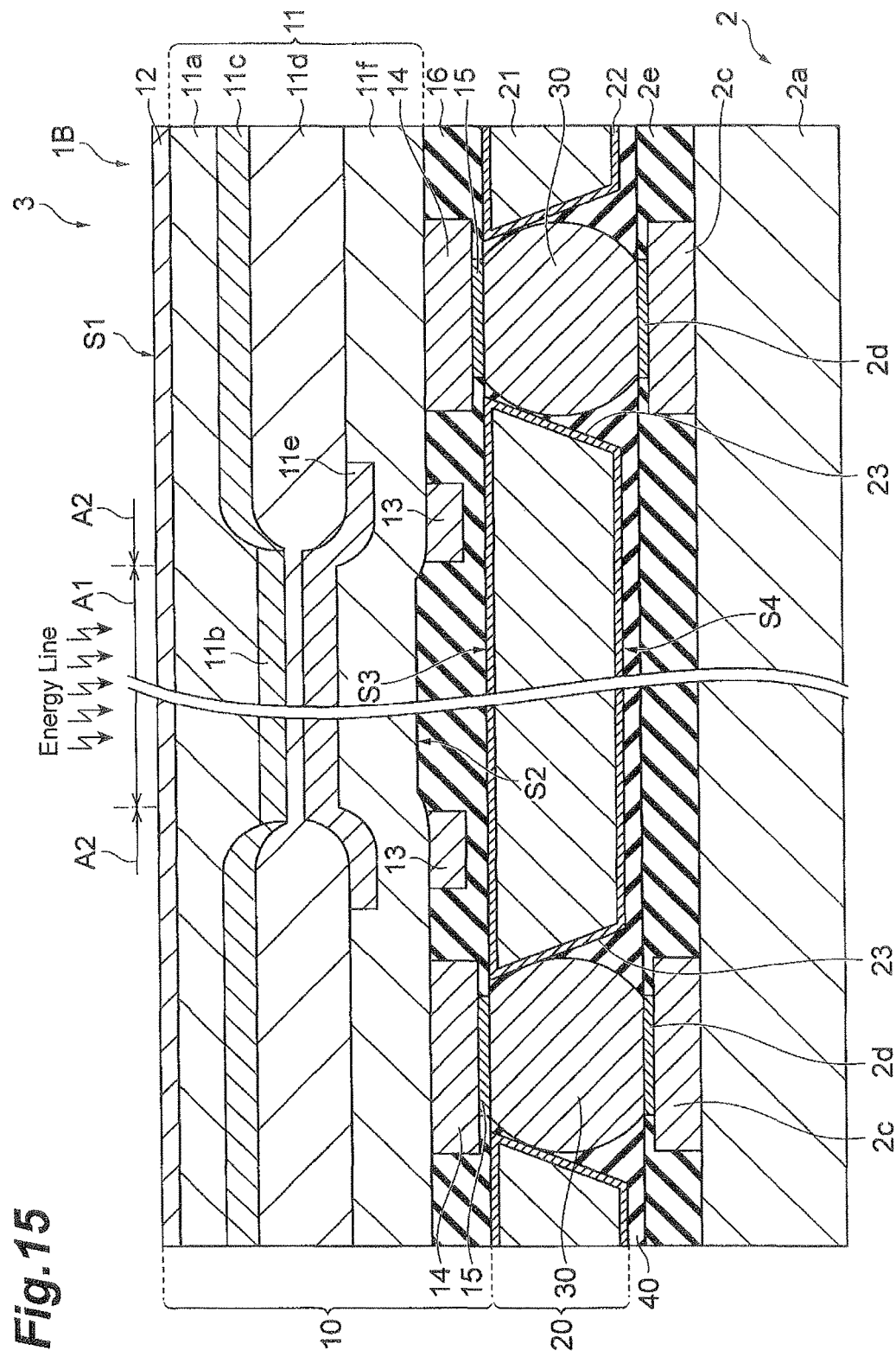
Figure 17:
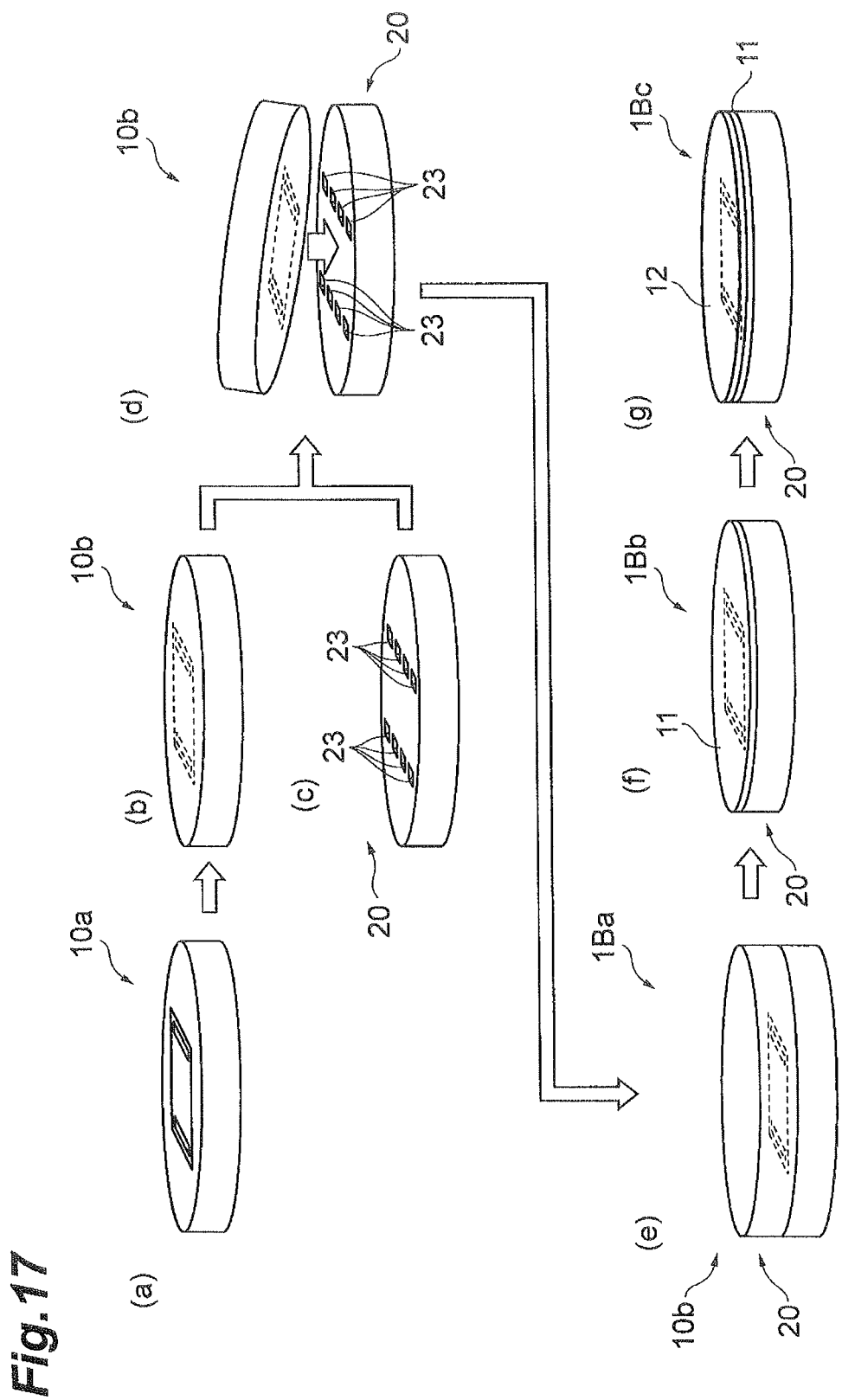
Figure 18:
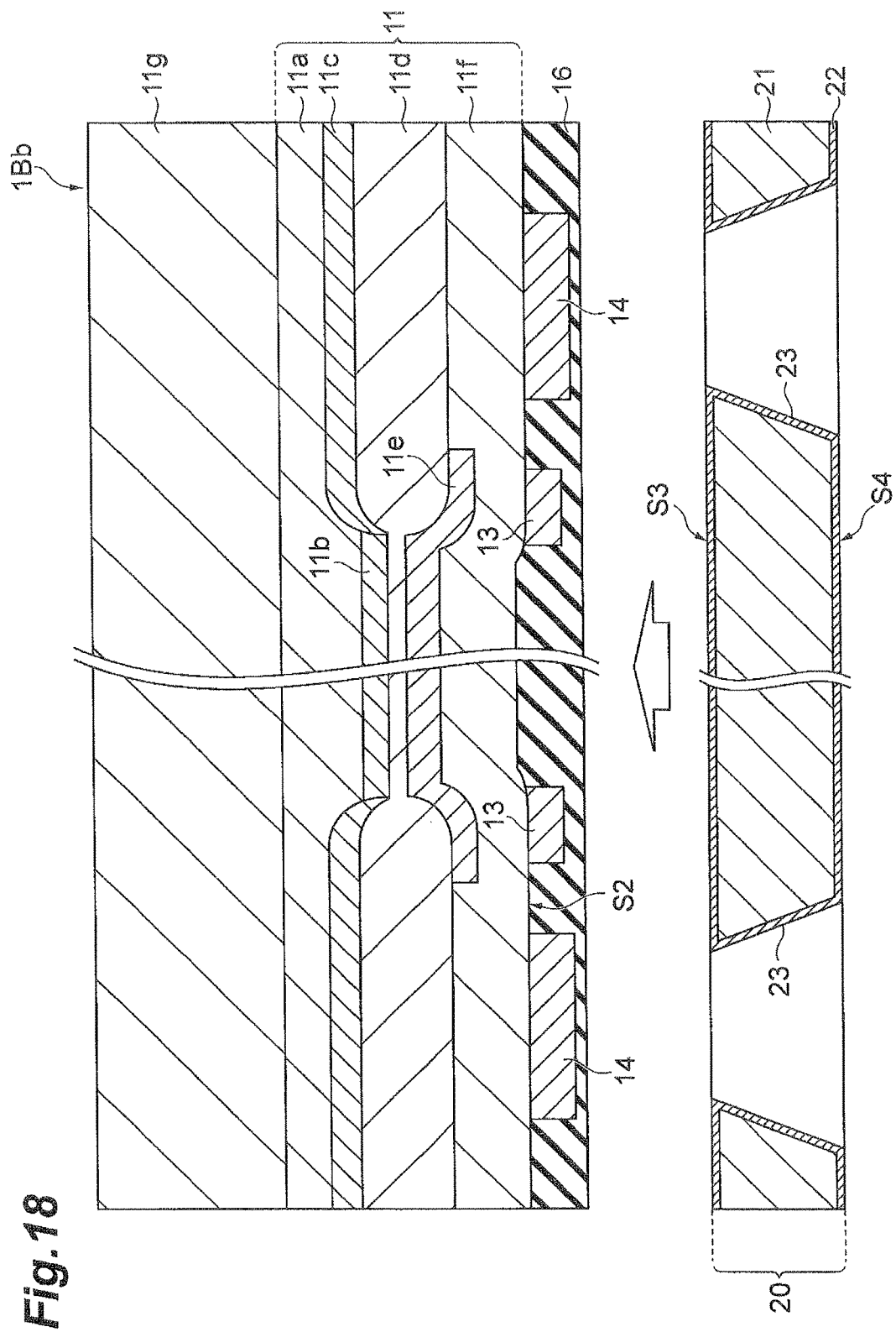
Figure 19:
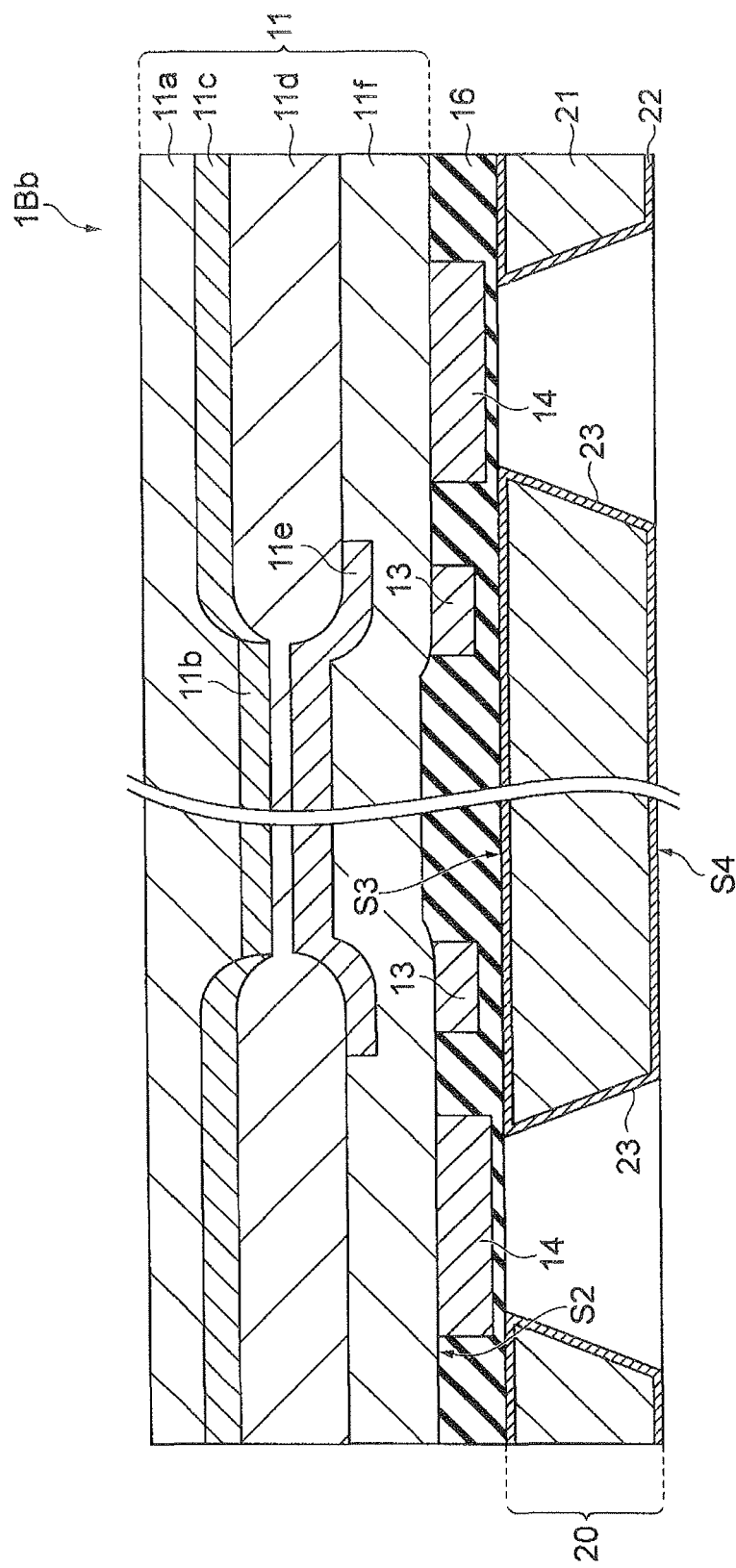
Figure 20:
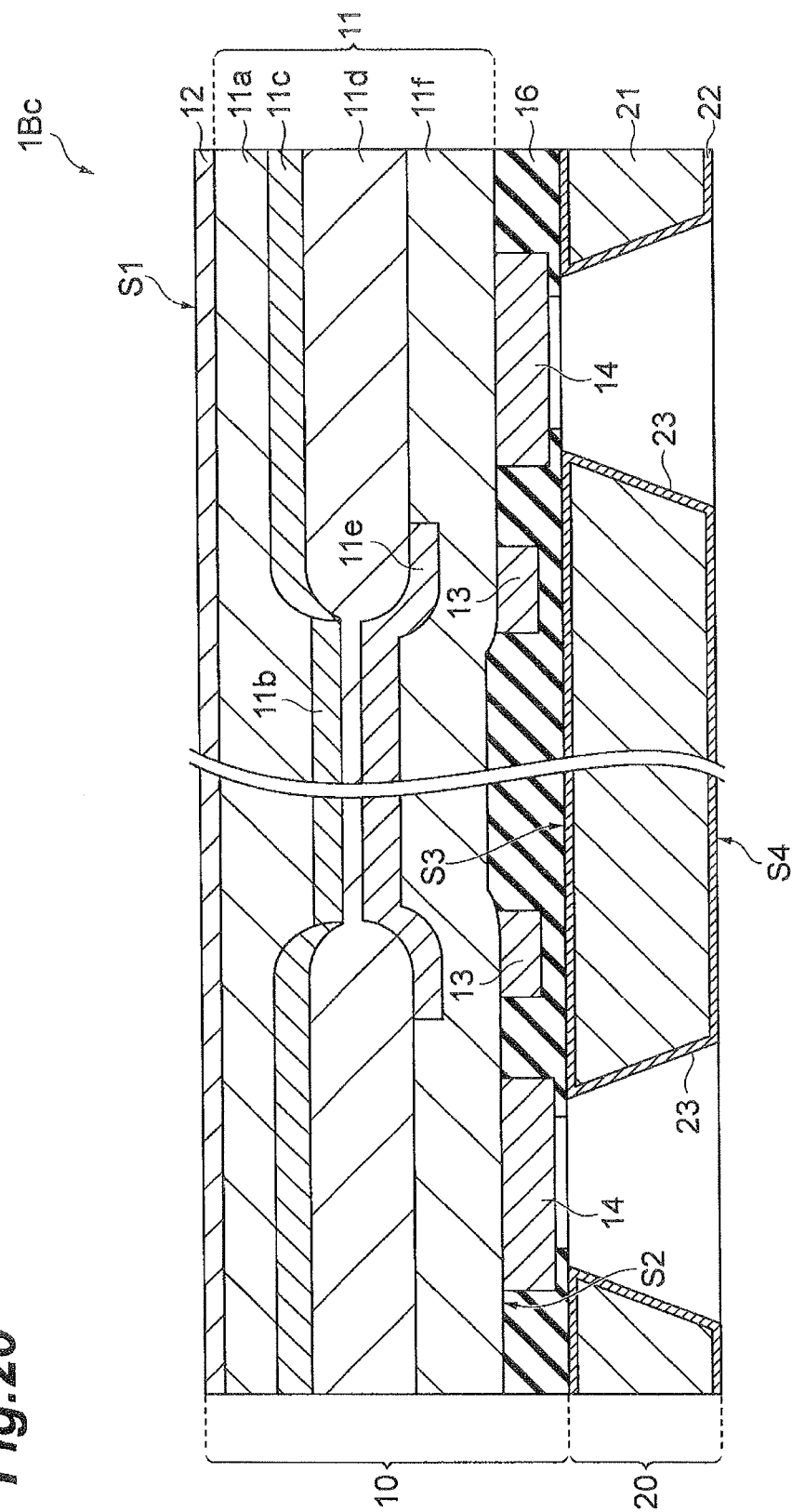
Figure 21:
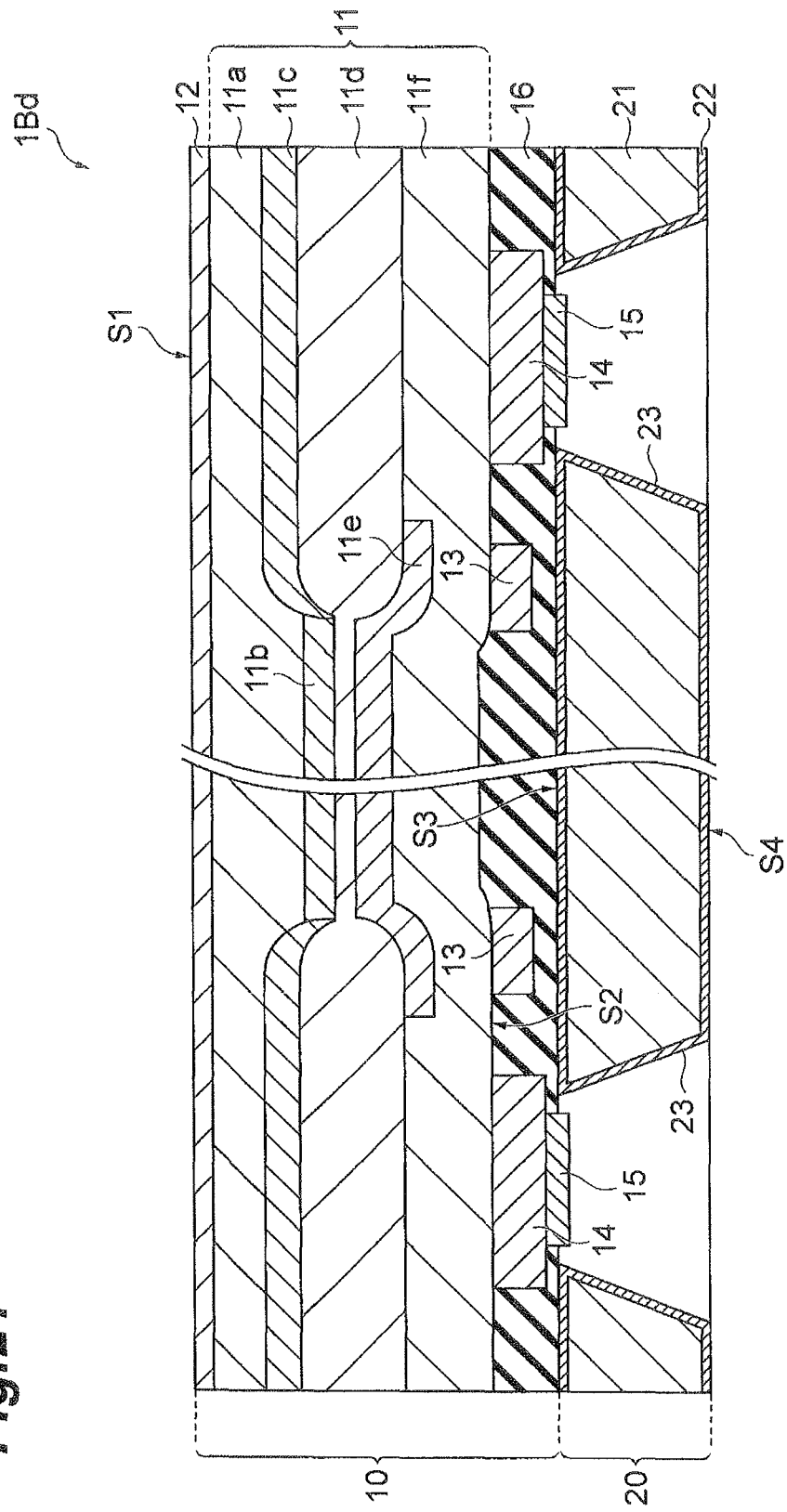

(a) of FIG. 4 is a diagram illustrating the solid-state imaging device in accordance with the first embodiment as seen from its support substrate side, while (b) of FIG. 4 is a diagram illustrating a state where solder balls are removed from (a) of FIG. 4;

FIG. 5 is a diagram illustrating a step of manufacturing the solid-state imaging device in accordance with the first embodiment;

FIG. 6 is a diagram illustrating a step of manufacturing the solid-state imaging device in accordance with the first embodiment;

FIG. 7 is a sectional view taken along the line VII-VII of FIG. 6;

FIG. 8 is a diagram illustrating a step of manufacturing the solid-state imaging device in accordance with the first embodiment;

FIG. 9 is a diagram illustrating a step of manufacturing the solid-state imaging device in accordance with the first embodiment;

FIG. 10 is a diagram illustrating a step of manufacturing the solid-state imaging device in accordance with the first embodiment;

FIG. 11 is a diagram illustrating a step of manufacturing the solid-state imaging device in accordance with the first embodiment;

FIG. 12 is a diagram illustrating a step of manufacturing the solid-state imaging device in accordance with the first embodiment;

FIG. 13 is a diagram illustrating a step of manufacturing the solid-state imaging device in accordance with the first embodiment;

(a) of FIG. 14 is a top plan view of the electronic component in accordance with a second embodiment, while (b) of FIG. 14 is a sectional view taken along the line B-B of (a) of FIG. 14;

FIG. 15 is a sectional view of the electronic component in accordance with the second embodiment, illustrating (b) of FIG. 14 in more detail under magnification;

(a) of FIG. 16 is a diagram illustrating the solid-state imaging device in accordance with the second embodiment as seen from its support substrate side, while (b) of FIG. 16 is a diagram illustrating a state where solder balls are removed from (a) of FIG. 16;

FIG. 17 is a diagram illustrating a step of manufacturing the solid-state imaging device in accordance with the second embodiment;

FIG. 18 is a diagram illustrating a step of manufacturing the solid-state imaging device in accordance with the second embodiment;

FIG. 19 is a diagram illustrating a step of manufacturing the solid-state imaging device in accordance with the second embodiment;

FIG. 20 is a diagram illustrating a step of manufacturing the solid-state imaging device in accordance with the second embodiment; and FIG. 21 is a diagram illustrating a step of manufacturing the solid-state imaging device in accordance with the second embodiment.

DESCRIPTION OF EMBODIMENTS

In the following, embodiments of the present invention will be explained in detail with reference to the drawings. In the explanation, the same constituents or those having the same functions will be referred to with the same signs while omitting their overlapping descriptions.

First Embodiment

Figure 1:
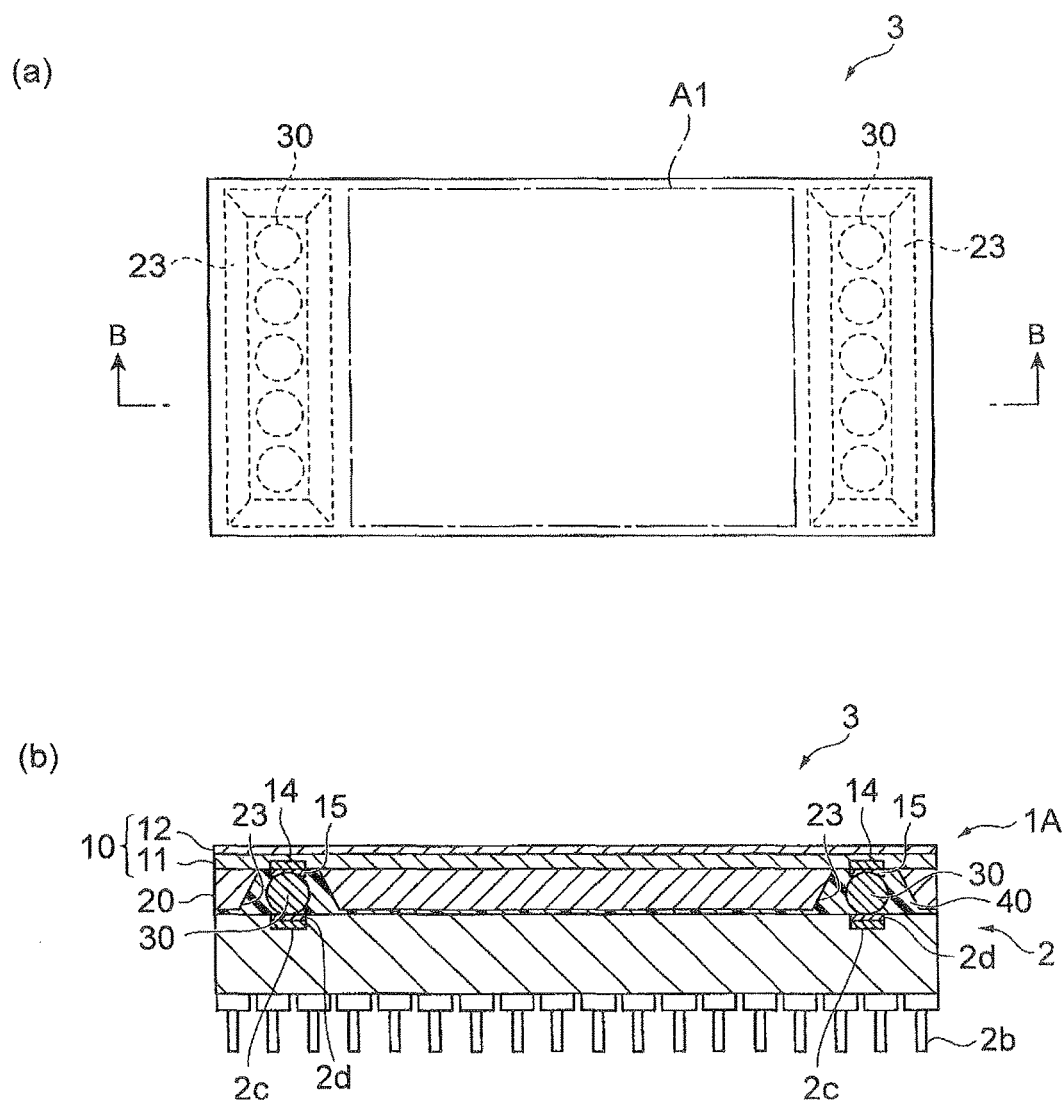

With reference to FIGS. 1 to 4, the structure of an electronic component 3 in which a solid-state imaging device 1A in accordance with the first embodiment is mounted on an IC chip 2 will be explained. As illustrated in FIG. 1, the solid-state imaging device 1A comprises a back-illuminated imaging element 10 of a CCD type, a support substrate 20 for supporting the imaging element 10, and a plurality of ball-shaped members 30.

Figure 2:
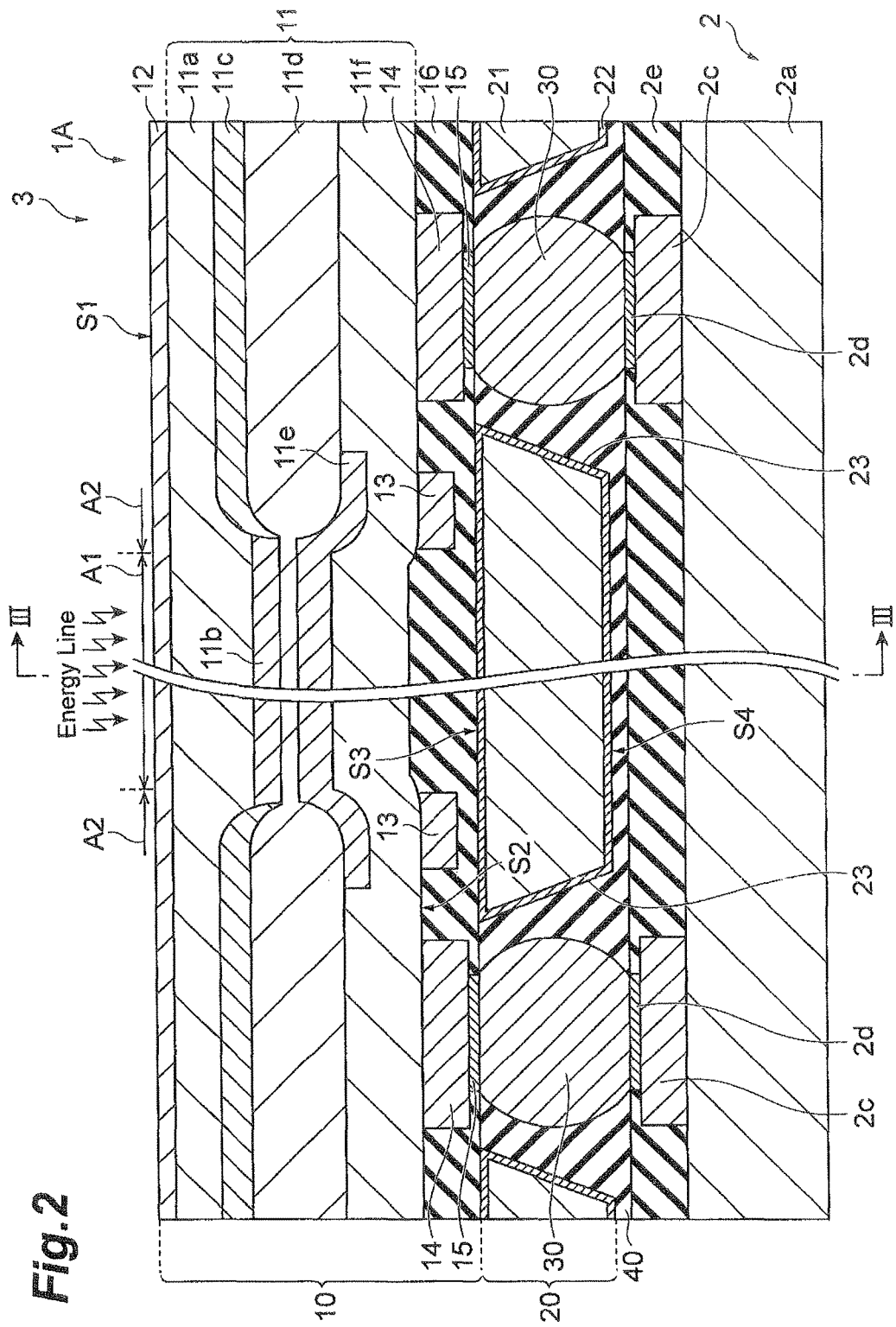
FIG. 2 is a sectional view of the electronic component in accordance with the first embodiment, illustrating (b) of FIG. 1 in more detail under magnification.

As illustrated in FIG. 2, the imaging element 10 has an element body 11, an AR coat 12, wiring 13, a plurality of electrodes 14, and plating films 15. The element body 11 includes a p-type semiconductor layer 11a, an n-type semiconductor layer 11b, a p+-type semiconductor layer 11c, an insulating layer 11d, electrode films 11e, and an interlayer insulating layer 11f.

The p-type semiconductor layer 11a has a protruded part thicker than the remaining part. The n-type semiconductor layer 11b is formed with a predetermined thickness on the protruded part. A p-n junction is formed at an interface between the p-type semiconductor layer 11a and the n-type semiconductor layer 11b. The vicinity of the interface functions as a photoelectric converter part, so as to photoelectrically convert various energy lines (e.g., light, UV rays, electron beams, radiations, charged particle beams, and the like) enter the interface, thereby generating signal charges.

The p+-type semiconductor layer 11c is arranged so as not to cover principal surfaces of the n-type semiconductor layer 11b but side faces of the n-type semiconductor layer 11b and a surface of the p-type semiconductor layer 11a. The insulating layer 11d is arranged so as to cover a principal surface of the n-type semiconductor layer 11b and a surface of the p+-type semiconductor layer 11c. The insulating layer 11d is constituted by $SiO_2$ or the like, for example. In the insulating layer 11d, the part covering the principal surface of the n-type semiconductor layer 11b is thinner than the part covering the surface of the p+-type semiconductor layer 11c.

Figure 3:
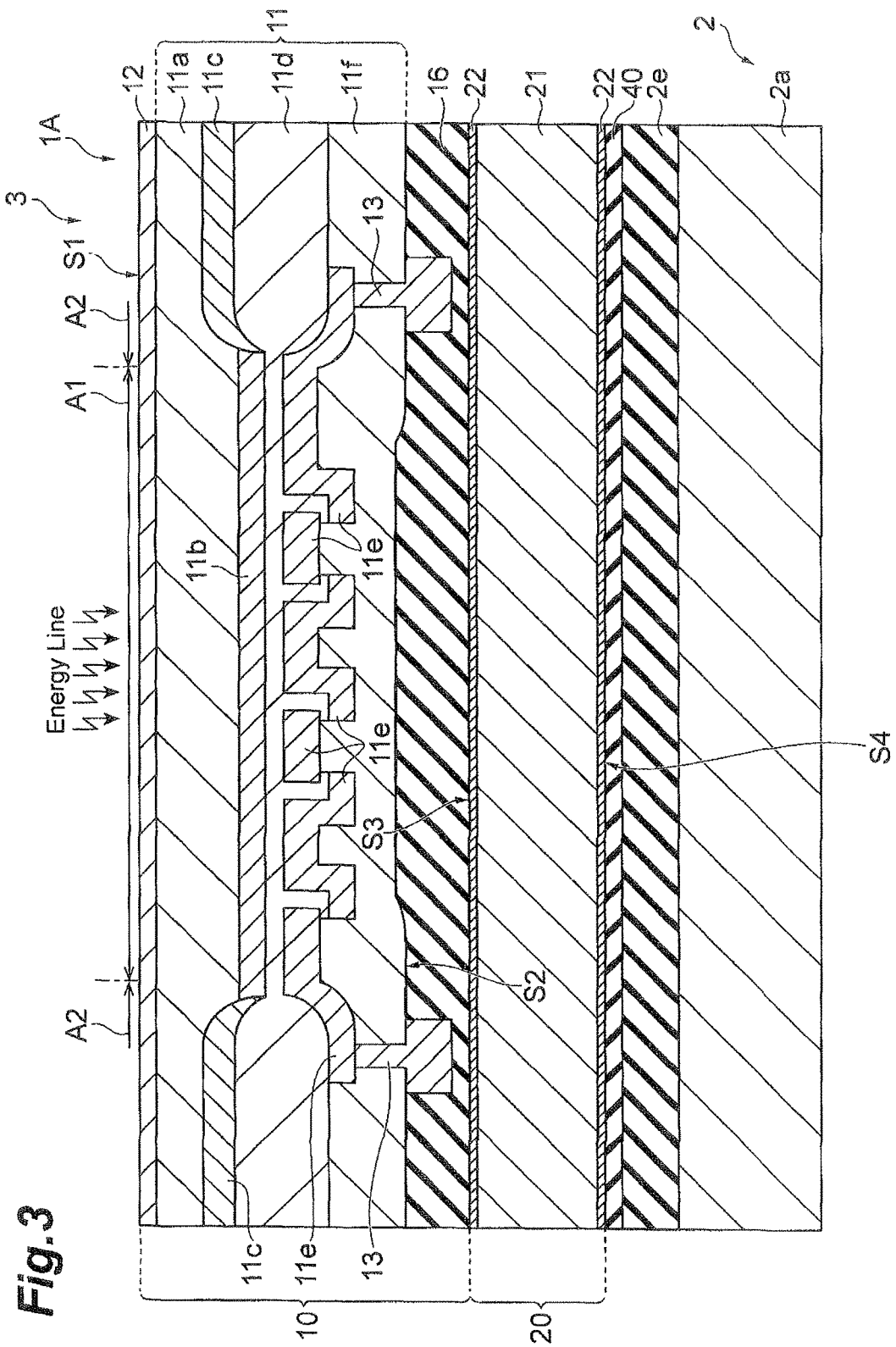
FIG. 3 is a sectional view taken along the line III-III of FIG. 2.

As illustrated in FIG. 2, each electrode film 11e is a belt-like film extending so as to cover the thin part of the insulating layer 11d and its vicinity. As illustrated in FIG. 3, a plurality of electrode films 11e are arranged in a row in the width direction of the imaging element 10. The electrode films 11e adjacent to each other are insulated from each other by the insulating film and have their end parts overlapping each other as seen in the thickness direction of the imaging element 10. The electrode films 11e are constituted by poly-Si, for example. The interlayer insulating layer 11f is arranged so as to cover the electrode films 11e and insulating layer 11d. The interlayer insulating layer 11f is constituted by boronphosphosilicate glass (BPSG) or the like, for example.

The AR coat 12 functions to prevent light in a predetermined wavelength band from being reflected. The AR coat 12 is constituted by $SiO_2$, SiN or the like, for example. The AR coat 12 is formed on a surface of the p-type semiconductor layer 11a. The wiring 13 and electrodes 14 are patterned on a surface of the interlayer insulating layer 11f (a principal surface S2 of the photoelectric converter part 11). The wiring 13 and electrodes 14 are constituted by Al or the like, for example. The wiring 13 and electrodes 14 have their thicknesses set on the order of 0.1 μm to 1 μm, for example.

As illustrated in (b) of FIG. 4, a plurality of electrodes 14 (five electrodes 14 in this embodiment) are arranged in one row each on both sides of a light detection area A1 as seen in the opposing direction of principal surfaces S1, S2. The plating films 15 are formed in a part of principal surfaces of the electrodes 14 in this embodiment. The plating films 15 are constituted by Au, Ni or the like, for example.

In thus constructed imaging element 10, a region where the p-type semiconductor layer 11a, n-type semiconductor layer 11b, insulating layer 11d, and electrode films 11e are stacked functions as the light detection area A1, while the other region functions as a wiring area A2. The surface on the AR coat 12 side of the imaging element 10 functions as the principal surface S1 on which the energy line enters. The surface on the interlayer insulating layer 11f side of the imaging element 10 functions as the principal surface S2 opposing the support substrate 20.

As illustrated in FIG. 2, a flattening film 16 is disposed on the principal surface S2 of the imaging element 10. The flattening film 16 is arranged so as to expose the principal surfaces of the plating films 15 but cover the interlayer insulating layer 11f, wiring 13, and plurality of electrodes 14. Therefore, the flattening film 16 flattens the surface of the interlayer insulating layer 11f that is irregular due to the presence of the wiring 13 and electrodes 14. The flattening film 16 is constituted by TEOS (tetraethoxysilane) or the like, for example.

As illustrated in FIG. 1, the support substrate 20 is joined to the imaging element 10 through the flattening film 16. As illustrated in FIG. 2, the support substrate 20 has a substrate 21 and an insulating film 22 covering all the surfaces of the substrate 21. The substrate 21 is constituted by Si, for example. The insulating film 22 is constituted by an oxide film formed by thermal oxidation or the like, for example.

The support substrate 20 is formed with two through holes 23 extending in its thickness direction in this embodiment. As illustrated in (a) of FIG. 1 and FIG. 4, the through holes 23 are arranged one by one on both sides of the light detection area A1 as seen in the opposing direction of the principal surfaces S1, S2. A plurality of plating films 15 (five plating films 15 in this embodiment) are exposed out of each through hole 23. As with the surfaces of the substrate 21, each through hole 23 is covered with the insulating film 22. That is, the support substrate 20 is provided with the through holes 23 extending in its thickness direction and having inner wall surfaces covered with the insulating film.

As illustrated in (b) of FIG. 1 and FIG. 2, each through hole 23 is formed such that the diameter thereof increases as the through hole 23 extends from one principal surface S3 of the support substrate to the other principal surface S4. That is, the inner wall surface of each through hole 23 is tapered. The through holes 23 are rectangular on both sides of the principal surfaces S3, S4. In the first embodiment, the opening width of the through hole 23 is set on a par with or larger than the diameter of the ball-shaped member 30.

The ball-shaped members 30 are conductive balls of solder, whose diameter can be set on the order of 100 µm to 1000 µm. The ball-shaped members 30 are arranged in the through holes 23 as illustrated in FIGS. 1 and 2, and (a) of FIG. 4. The ball-shaped members 30 correspond to the electrodes 14 and plating films 15 individually and are electrically connected to the respective electrodes 14 and plating films 15.

As illustrated in (b) of FIG. 1 and FIG. 2, the IC chip 2 has a chip body 2a, a plurality of lead terminals 2b, electrodes 2c, plating films 2d, and an insulating film 2e. The chip body 2a carries out signal processing of electric signals outputted from the imaging element 10, operation control of the imaging element 10, and the like. The plurality of lead terminals 2b extend from the chip body 2a and are electrically connected to electrodes of an undepicted circuit substrate or the like when the IC chip 2 is mounted on the latter.

The electrodes 2c are patterned on the chip body 2a. The electrodes 2c are constituted by Al or the like, for example. In this embodiment, the plating films 2d are arranged on a part of principal surfaces of the electrodes 2c. The plating films 2d are constituted by Au, Ni or the like, for example. The insulating film 2e is formed so as to expose principal surfaces of the plating films 2d but cover the chip body 2a and electrodes 2c. The insulating film 2e is constituted by $SiO_2$ or the like, for example.

For securely fixing the ball-shaped members 30 into the through holes 23 and reliably securing the solid-state imaging device 1A and the IC chip to each other, a resin material 40 fills the through holes 23 and the interstices between the solid-state imaging device 1A and the IC chip 2. As the resin material, an epoxy resin or the like can be used, for example.

With reference to FIGS. 2, 3, and 5 to 13, a method for manufacturing the electronic component 3 equipped with the solid-state imaging device 1A in accordance with the first embodiment will now be explained. First, as illustrated in (a) of FIG. 5 and FIG. 6, a precursor 10a for the imaging element 10 is produced. Specifically, as illustrated in FIG. 6, a so-called epi-wafer in which the p-type semiconductor layer 11a is epitaxially grown on a surface of a p+ semiconductor substrate 11g is prepared at first. The thickness of the substrate 11g is about 620 µm, for example, while the thickness of the p-type semiconductor layer 11a is 10 µm to 30 µm, for example.

Next, by so-called LOCOS process, p-type impurities are added onto the epi-wafer (p-type semiconductor layer 11a) by ion implantation using an $Si_3N_4$ film (not depicted) as a mask, so as to form the p+-type semiconductor layer 11c. Subsequently, using the same $Si_3N_4$ film as a mask, the insulating layer 11d is formed by oxidation. After removing the $Si_3N_4$ film, the n-type semiconductor layer 11b is formed by adding n-type impurities by ion implantation, and the electrode films 11e and the interlayer insulating layer 11f are layered thereon in this order. At this time, a plurality of belt-like electrode films 11e are formed so that end parts of the electrode films 11e adjacent to each other overlap as seen in the thickness direction of the imaging element 10 (see FIG. 7). This forms the element body 11 on the substrate 11g. Then, the wiring 13 and electrodes 14 are patterned on the interlayer insulating layer 11f (principal surface S2). Thus, the precursor 10a for the imaging element 10 illustrated in (a) of FIG. 5 and FIG. 6 is formed.

Subsequently, as illustrated in FIG. 8, the flattening film 16 is formed on the interlayer insulating layer 11f (on the principal surface S2) so as to cover the wiring 13 and electrodes 14. The thickness of the flattening film 16 can be set on the order of 1 µm to 5 µm, for example. Then, as illustrated in FIG. 9, the surface of the flattening film 16 is flattened by chemical mechanical polishing (CMP). This forms a precursor 10b for the imaging element 10 illustrated in (b) of FIG. 5 and FIG. 9. At this time, the wiring 13 and electrodes 14 are still covered with the flattening film 16.

Next, as illustrated in (c) of FIG. 5, the support substrate 20 provided with the through holes 23 is prepared. Here, by thermal oxidation or the like, the inner wall surface of each through hole 23 is formed with a high-quality oxide film having a uniform thickness. Then, as illustrated in (d) of FIG. 5 and FIG. 10, the precursor 10b for the imaging element 10 and the support substrate 20 are aligned with each other so that the principal surfaces S2, S3 oppose each other while exposing five electrodes 14 out of each through hole 23, and the precursor 10b for the imaging element 10 and the support substrate 20 are joined to each other. The precursor 10b and the support substrate 20 may be joined to each other either directly by ambient temperature bonding while pressing them against each other or with an adhesive (not depicted) such as a resin applied to the principal surface S2 of the precursor 10b, for example. This forms a precursor 1Aa for the solid-state imaging device 1A as illustrated in (e) of FIG. 5.

Subsequently, the substrate 11g in the precursor 1Aa is removed by etching, polishing, or the like, so as to expose the p-type semiconductor layer 11a. Here, the thickness from the p-type semiconductor layer 11a to the flattening film 16 is set on the order of 10 µm to 30 µm, for example. This forms a precursor 1Ab for the solid-state imaging device 1A illustrated in (f) of FIG. 5 and FIG. 11. Then, the AR coat 12 is formed on a surface of the p-type semiconductor layer 11a in the precursor 1Ab for the solid-state imaging device 1A. Thereafter, areas to be formed with the plating films 15 in the electrodes 14 are exposed by etching with a resist or the like. This forms a precursor 1Ac for the solid-state imaging device 1A illustrated in (g) of FIG. 5 and FIG. 12.

Next, the plating films 15 are formed so as to cover the exposed electrodes 14. This forms a precursor 1Ad for the solid-state imaging device 1A illustrated in FIG. 13. Then, five ball members 30 are arranged in each through hole 23 and electrically connected to their corresponding plating films 15. This completes the solid-state imaging device 1A.

Subsequently, the solid-state imaging device 1A is mounted on the IC chip 2. Specifically, the ball-shaped members 30 and the electrodes 2c of the IC chip 2 are aligned with each other and joined to each other by flip-chip bonding. As a consequence, the solid-state imaging device 1A and the IC chip 2 are electrically connected to each other through the ball-shaped members 30. Then, the resin material 40 is caused to fill the through holes 23 and the interstices between the solid-state imaging device 1A and the IC chip 2. This completes the electronic component 3 illustrated in FIG. 2.

In thus configured first embodiment, the ball-shaped members 30 are arranged in the through holes 23 of the support substrate 20 joined to the imaging element 10, and the ball-shaped members 30 and the electrodes 14 are electrically connected to each other. Therefore, the electrical connection step is easy when manufacturing the solid-state imaging device 1A. Hence, the solid-state imaging device 1A can be manufactured easily, and the yield can be improved.

Meanwhile, the conventional method for manufacturing a solid-state imaging device includes the steps of joining a sensor to a support substrate, forming a resist pattern on the other principal surface of the support substrate, forming a through hole by etching the support substrate from the other principal surface side, and forming a through electrode by filling the through hole with a metal. For securing insulation between the support substrate (the inner wall surface of the through hole) and the electrode when forming the electrode in the through hole, it is necessary for a high-quality oxide film having a uniform thickness to be formed on the inner wall surface of the through hole by a method such as CVD (Chemical Vapor Deposition) or the like, for example. In this case, however, it takes a high degree of difficulty to obtain an insulating film with a sufficient quality, whereby reliability is hard to secure.

By contrast, the first embodiment can prepare a high-quality oxide film having a uniform thickness beforehand on the inner wall surfaces of the through holes 23 of the support substrate 20 by thermal oxidation or the like. Therefore, sufficient insulation can be secured between the support substrate 20 (the inner wall surfaces of the through holes 23) and the electrodes, whereby the highly reliable solid-state imaging device 1A can be obtained.

The first embodiment forms the electrodes 14 with the plating films 15. Therefore, the ball-shaped members 30 can be connected to the electrodes 14 more securely through the plating films 15.

In the first embodiment, the through holes 23 is formed such that the diameter thereof increases as the through hole 23 extends from the principal surface S3 to the principal surface S4. This makes it easier to arrange the ball-shaped members 30 in the through holes 23.

In the first embodiment, the resin material 40 is arranged in the through holes 23. Therefore, the ball-shaped members 30 can securely be fixed into the through holes 23 by the resin material 40.

In the first embodiment, the solid-state imaging device 1A further comprises the flattening film 16 for covering the surface of the interlayer insulating layer 11f and the wiring 13. Hence, the surface of the imaging element 10 is flattened by the flattening film 16, whereby the joint between the imaging element 10 and the support substrate 20 becomes more secure.

Second Embodiment

With reference to FIGS. 14 to 16, the structure of the electronic component 3 in which a solid-state imaging device 1B in accordance with the second embodiment is mounted on the IC chip 2 will now be explained. The solid-state imaging device 1B differs from the solid-state imaging device 1A in the size and number of through holes 23 in the support substrate 20. These differences will mainly be explained in the following.

As illustrated in FIG. 14, the support substrate 20 is formed with through holes 23, extending in its thickness direction, by the same number as with the electrodes 14. In this embodiment, eight through holes 23 are formed. As illustrated in (a) of FIG. 14 and FIG. 16, the through holes 23 are arranged four by four on both sides as seen in the opposing direction of the principal surfaces S1, S2. One plating film 15 is exposed out of each through hole 23.

As illustrated in (b) of FIG. 14 and FIG. 15, each through hole 23 is formed such that the diameter thereof increases as the through hole 23 extends from the principal surface S3 to the principal surface S4. That is, the inner wall surface of each through hole 23 is tapered. The openings of the through hole 23 are square on both sides of the principal surfaces S3, S4. The sizes of openings and angles of inner wall surfaces of the through holes 23 are set so that the ball-shaped members 30 abut against the plating films 15 and inner wall surfaces when arranged in the through holes 23 (see (b) of FIG. 14 and FIG. 15).

A method for manufacturing the electronic component 3 equipped with the solid-state imaging device 1B in accordance with the second embodiment will now be explained with reference to FIGS. 15 and 17 to 21. The steps up to preparing the precursor 10a for the imaging element 10 (see (a) of FIG. 17) and obtaining the precursor 10b by forming the flattening film 16 on the principal surface S2 of the precursor 10a (see (b) of FIG. 17) are the same as with the first embodiment.

Next, as illustrated in (c) of FIG. 17, the support substrate 20 provided with eight through holes 23 is prepared. Subsequently, as illustrated in (d) of FIG. 17 and FIG. 18, the precursor 10b for the imaging element 10 and the support substrate 20 are aligned with each other so that the principal surfaces S2, S3 oppose each other while exposing one electrode 14 out of each through hole 23, and the precursor 10b and the support substrate 20 are joined to each other. This forms a precursor 1Ba for the solid-state imaging device 1B as illustrated in (e) of FIG. 17.

Subsequently, the substrate 11g in the precursor 1Ba is removed by etching, polishing, or the like, so as to expose the p-type semiconductor layer 11a. This forms a precursor 1Bb for the solid-state imaging device 1B illustrated in (f) of FIG. 17 and FIG. 19. Then, the AR coat 12 is formed on a surface of the p-type semiconductor layer 11a in the precursor 1Bb for the solid-state imaging device 1B. Thereafter, areas to be formed with the plating films 15 in the electrodes 14 are exposed by etching with a resist or the like. This forms a precursor 1Bc for the solid-state imaging device 1B illustrated in (g) of FIG. 17 and FIG. 20.

Next, the plating films 15 are formed so as to cover the exposed electrodes 14. This forms a precursor 1Bd for the solid-state imaging device 1B illustrated in FIG. 21. Then, the ball members 30 are arranged individually in the through holes 23 and electrically connected to their corresponding plating films 15. This completes the solid-state imaging device 1B.

Subsequently, the solid-state imaging device 1B is mounted on the IC chip 2. Specifically, the ball-shaped members 30 and the electrodes 2c of the IC chip 2 are aligned with each other and joined to each other by flip-chip bonding. As a consequence, the solid-state imaging device 1B and the IC chip 2 are electrically connected to each other through the ball-shaped members 30. Then, the resin material 40 fills the through holes 23 and the interstices between the solid-state imaging device 1B and the IC chip 2. This completes the electronic component 3 illustrated in FIG. 15.

Thus configured solid-state imaging device 1B in accordance with the second embodiment exhibits the same operations and effects as with the solid-state imaging device 1A in accordance with the first embodiment.

In the second embodiment, the through holes 23 is formed such that the diameter thereof increases as the through hole 23 extends from the principal surface S3 to the principal surface S4. This makes it easier to arrange the ball-shaped members 30 in the through holes 23. In the second embodiment, the ball-shaped member 30 abuts against each inner wall surface of the through hole 23 and thus is stabilized in the through hole 23. The step of aligning the ball-shaped member 30 with the electrode 2c also becomes easier.

In the second embodiment, the support substrate 20 is provided with a plurality of through holes 23, while the electrodes 14 (plating films 15) correspond to the through holes 23 individually. Therefore, simply arranging the ball-shaped members 30 individually in the through holes 23 can easily make the ball-shaped members 30 and the electrodes 14 correspond to each other.

While embodiments of the present invention are explained in detail in the foregoing, the present invention is not limited to the above-mentioned embodiments. For example, the flattening film 16, which is flattened by CMP in the above-mentioned embodiments, is not required to be flattened by CMP when the imaging element 10 and the support substrate 20 are bonded to each other by an adhesive or the like, since the flatness required for the bonding surfaces in this case is not so high as that in the ambient temperature bonding.

The flattening film 16 disposed on the principal surface S2 of the photoelectric converter part 11 in the above-mentioned embodiments may be omitted.

The through holes 23, which is formed such that the diameter thereof increases as the through hole 23 extends from the principal surface S3 to the principal surface S4 in the above-mentioned embodiments, may have a fixed size of openings in their extending direction. The through holes 23 may narrow from the principal surface S3 to the principal surface S4.

While the above-mentioned embodiments fill the through holes 23 and the interstices between the solid-state imaging device 1A, 1B and the IC chip 2 with the resin material 40 after electrically connecting the solid-state imaging device 1A, 1B and the IC chip 2 to each other, the interstices between the solid-state imaging device 1A, 1B and the IC chip 2 may be filled with the resin material 40 after electrically connecting the solid-state imaging device 1A, 1B having the through holes 23 filled beforehand with the resin material 40 to the IC chip.

The through holes 23 and the interstices between the solid-state imaging device 1A, 1B and the IC chip 2, which are filled with the resin material 40 in the above-mentioned embodiments, may be free of the resin material 40.

The ball-shaped member 30, which is spherical in the above-mentioned embodiments, may partly have a spherical surface.

While the above-mentioned embodiments are explained in terms of a CCD-type solid-state imaging device as a solid-state imaging device by way of example, it is needless to mention that the present invention is employable in various back-illuminated light-receiving element arrays such as CMOS-type solid-state imaging devices without being limited to CCD-type solid-state imaging devices.

REFERENCE SIGNS LIST 1A, 1B . . . solid-state imaging device; 2 . . . IC chip; 3 . . . electronic component; 10 . . . imaging element; 11 . . . photoelectric converter part; 14 . . . electrode; 15 . . . plating film; 16 . . . flattening film; 20 . . . support substrate; 23 . . . through hole; 30 . . . ball-shaped member; 40 . . . resin material; S1, S2, S3, S4 . . . principal surface.

The invention claimed is:

1. A solid-state imaging device comprising:
an imaging element including a first principal surface configured to receive an energy line incident thereon, a second principal surface located on an opposite side of the imaging element as the first principal surface and having at least one electrode arranged thereon, and a photoelectric converter part configured to photoelectrically convert the incident energy line so as to generate a signal charge;
a support substrate, provided with a through hole extending in a thickness direction thereof, having third and fourth principal surfaces located on opposite sides of the support substrate, the support substrate being joined to the imaging element so that the electrode is vertically aligned to the through hole while the second and third principal surfaces face each other; and
at least one conductive ball-shaped member arranged in the through hole, electrically connected to the electrode and having a diameter greater than a thickness of the support substrate as measured between the third principal surface and the fourth principal surface; and
a flattening film covering the second principal surface,
wherein a part of the ball-shaped member projects outside the fourth principal surface of the support substrate; and
wherein at least a part of a surface of the electrode is exposed out of the flattening film.

2. The solid-state imaging device according to claim 1, wherein the electrode is formed with a plating film.

3. A solid-state imaging device, comprising:
an imaging element including a first principal surface configured to receive an energy line incident thereon, a second principal surface opposing the first principal surface and having at least one electrode arranged thereon, and a photoelectric converter part configured to photoelectrically convert the incident energy line so as to generate a signal charge;
a support substrate, provided with a through hole extending in a thickness direction thereof, having third and fourth principal surfaces opposing each other, the support substrate being joined to the imaging element so that the electrode is vertically aligned to the through hole while the second and third principal surfaces face each other; and
at least one conductive ball-shaped member arranged in the through hole, electrically connected to the electrode and having a diameter greater than a thickness of the support substrate; and
a flattening film covering the second principal surface,
wherein a part of the ball-shaped member projects outside the fourth principal surface of the support substrate,
wherein at least a part of a surface of the electrode is exposed out of the flattening film, and
wherein the through hole is formed such that the diameter thereof increases as the through hole extends from the third principal surface to the fourth principal surface.

4. The solid-state imaging device according to claim 1, wherein the imaging element is provided with a plurality of electrodes exposed out of the through hole; and
wherein a plurality of ball-shaped members are electrically connected to respective electrodes.

5. The solid-state imaging device according to claim 1, wherein the one electrode is exposed out of one through hole; and
wherein the ball-shaped members are electrically connected to each electrode individually.

6. The solid-state imaging device according to claim 1, wherein a resin material is arranged between the ball-shaped member and the through hole.

7. The solid-state imaging device according to claim 1, wherein the flattening film is constituted by TEOS.

* * * * *